(12) United States Patent
Lee et al.

(10) Patent No.: US 11,925,054 B2
(45) Date of Patent: Mar. 5, 2024

(54) DISPLAY APPARATUS INCLUDING GROOVE BETWEEN DAMS

(71) Applicant: Samsung Display Co., Ltd., Yongin-si (KR)

(72) Inventors: Jiyoun Lee, Yongin-si (KR); Hyunyoung Kim, Yongin-si (KR); Sunbeom Kwon, Yongin-si (KR); Kyuree Kim, Yongin-si (KR); Rohyeon Park, Yongin-si (KR); Jongryuk Park, Yongin-si (KR); Insuk Yang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 164 days.

(21) Appl. No.: 17/447,040

(22) Filed: Sep. 7, 2021

(65) Prior Publication Data

US 2022/0077425 A1 Mar. 10, 2022

(30) Foreign Application Priority Data

Sep. 8, 2020 (KR) .................. 10-2020-0114863

(51) Int. Cl.
*H10K 50/84* (2023.01)
*H10K 50/15* (2023.01)
(Continued)

(52) U.S. Cl.
CPC .......... *H10K 50/844* (2023.02); *H10K 50/15* (2023.02); *H10K 50/16* (2023.02); *H10K 50/171* (2023.02); *H10K 59/1213* (2023.02); *H10K 59/1216* (2023.02); *H10K 59/40* (2023.02); *G02F 1/133331* (2021.01); *H10K 50/17* (2023.02); *H10K 50/868* (2023.02); (Continued)

(58) Field of Classification Search
CPC ...... H10K 50/844; H10K 50/15; H10K 50/16; H10K 50/17; H10K 50/171; H10K 50/8426; H10K 50/868; H10K 59/1213; H10K 59/1216; H10K 59/40; H10K 59/12; H10K 59/122; H10K 59/121; H10K 59/131; H10K 59/124; H10K 77/10; H10K 2102/351; H01L 27/124; G02F 1/133331
See application file for complete search history.

(56) References Cited

U.S. PATENT DOCUMENTS 9,818,807 B2 * 11/2017 Park .................. H10K 59/124
10,304,913 B2 5/2019 Choi et al.
(Continued)

FOREIGN PATENT DOCUMENTS

KR 10-2017-0066767 A 6/2017
KR 10-2018-0063633 A 6/2018
(Continued)

*Primary Examiner* — Ida M Soward
(74) *Attorney, Agent, or Firm* — Lewis Roca Rothgerber Christie LLP

(57) ABSTRACT

A display apparatus includes: a substrate including a first area, a second area, and a third area; a display element on the substrate; a thin-film encapsulation layer covering the display element; a first dam portion at the third area, the first dam portion being adjacent to the second area; a second dam portion at the third area, and spaced from the first dam portion; and at least one groove at the third area.

30 Claims, 26 Drawing Sheets

(51) Int. Cl.
    *H10K 50/16*    (2023.01)
    *H10K 50/17*    (2023.01)
    *H10K 50/844*    (2023.01)
    *H10K 59/12*    (2023.01)
    *H10K 59/121*    (2023.01)
    *H10K 59/40*    (2023.01)
    *G02F 1/1333*    (2006.01)
    *H10K 50/80*    (2023.01)
    *H10K 59/124*    (2023.01)
    *H10K 59/131*    (2023.01)
    *H10K 102/00*    (2023.01)

(52) U.S. Cl.
    CPC ......... *H10K 59/124* (2023.02); *H10K 59/131* (2023.02); *H10K 2102/351* (2023.02)

(56) References Cited

U.S. PATENT DOCUMENTS

| | | | |
|---|---|---|---|
| 10,466,822 B2 | 11/2019 | Kim et al. | |
| 10,541,380 B1* | 1/2020 | Sung | ............ H10K 59/124 |
| 11,296,167 B2 | 4/2022 | Koo et al. | |
| 11,355,728 B2* | 6/2022 | Kim | ............ H10K 50/8426 |
| 11,469,392 B2* | 10/2022 | Zhang | ............ H01L 29/458 |
| 2016/0204373 A1* | 7/2016 | Park | ............ H10K 59/124 |
| | | | 257/40 |
| 2017/0148856 A1* | 5/2017 | Choi | ............ H10K 59/124 |
| 2019/0081273 A1 | 3/2019 | Sung et al. | |
| 2019/0245159 A1* | 8/2019 | Kim | ............ H10K 50/8426 |
| 2019/0334120 A1* | 10/2019 | Seo | ............ G06F 3/0444 |
| 2020/0083306 A1* | 3/2020 | Choi | ............ H10K 50/8426 |
| 2020/0119304 A1* | 4/2020 | Choi | ............ H10K 59/80 |
| 2020/0168823 A1* | 5/2020 | Kim | ............ H10K 59/122 |
| 2020/0194714 A1* | 6/2020 | Won | ............ H10K 59/123 |
| 2020/0212356 A1* | 7/2020 | Kim | ............ H10K 59/122 |
| 2020/0235180 A1 | 7/2020 | Park et al. | |
| 2020/0303677 A1 | 9/2020 | Lee et al. | |
| 2021/0210565 A1* | 7/2021 | Lim | ............ H10K 59/65 |
| 2021/0408462 A1* | 12/2021 | Tang | ............ H10K 59/122 |

FOREIGN PATENT DOCUMENTS

| | | | | |
|---|---|---|---|---|
| KR | 10-2083315 B1 | 3/2020 | | |
| KR | 10-2020-0090595 A | 7/2020 | | |
| KR | 20200090595 A | * 7/2020 | ............ H10K 59/12 |
| KR | 10-2020-0113092 A | 10/2020 | | |
| KR | 10-2021-0049253 A | 5/2021 | | |

* cited by examiner

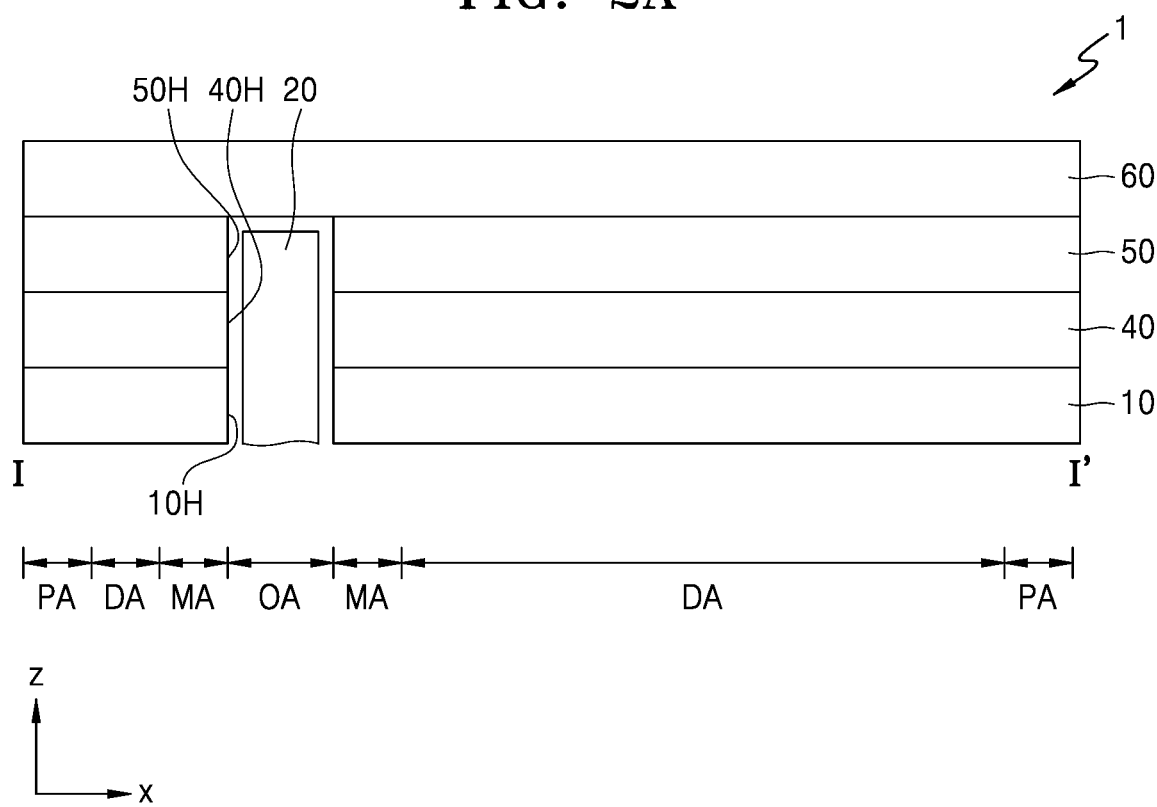

DISPLAY APPARATUS INCLUDING GROOVE BETWEEN DAMS

CROSS-REFERENCE TO RELATED APPLICATION

This application claims priority to and the benefit of Korean Patent Application No. 10-2020-0114863, filed on Sep. 8, 2020, in the Korean Intellectual Property Office, the entire disclosure of which is incorporated by reference herein.

BACKGROUND

1. Field

One or more embodiments relate to a display apparatus, and more particularly, to a display apparatus including a first region inside a display area.

2. Description of Related Art

Display apparatuses have been used for various purposes. In addition, because the thickness and weight of display apparatuses have been reduced, the range of utilization of display apparatuses has increased.

While an area occupied by a display area of display apparatuses has increased, various functions have been added or linked to the display apparatuses. As a method of adding various functions while increasing an area, research is being conducted on display apparatuses having various elements arranged in the display area.

The above information disclosed in this Background section is for enhancement of understanding of the background of the present disclosure, and therefore, it may contain information that does not constitute prior art.

SUMMARY

One or more embodiments of the present disclosure are directed to a display apparatus including a first region in a display area that may be utilized for various suitable purposes, for example, such as arranging various suitable kinds of components therein. However, the aspects and features of the present disclosure are not limited thereto.

Additional aspects and features of the present disclosure will be set forth, in part, in the description which follows, and in part, will be apparent from the description, or may be learned by practicing one or more of the presented embodiments of the present disclosure.

According to one or more embodiments of the present disclosure, a display apparatus includes: a substrate including a first area, a second area, and a third area between the first area and the second area, the first area having a through hole; a display element at the second area, the display element including a pixel electrode, an opposite electrode, and an intermediate layer between the pixel electrode and the opposite electrode, and the intermediate layer including at least one organic material layer; a thin-film encapsulation layer covering the display element, and including a first inorganic encapsulation layer, a second inorganic encapsulation layer, and an organic encapsulation layer between the first inorganic encapsulation layer and the second inorganic encapsulation layer; a first dam portion at the third area, the first dam portion being adjacent to the second area; a second dam portion at the third area, and spaced from the first dam portion; and at least one groove at the third area. The at least one organic material layer of the intermediate layer is disconnected by the at least one groove, a grove from among the at least one groove is between the first dam portion and the second dam portion, and at least a part of the organic encapsulation layer is at the at least one groove.

In an embodiment, the display apparatus may further include a multi-layered film between the substrate and the opposite electrode, the multi-layered film including a first organic insulating layer, a second organic insulating layer, and a metal layer between the first organic insulating layer and the second organic insulating layer.

In an embodiment, the at least one groove may be in the multi-layered film.

In an embodiment, the display apparatus may further include a pixel circuit including a thin-film transistor and a storage capacitor, the thin-film transistor being electrically connected to the display element. A contact metal layer may connect the display element and the thin-film transistor to each other, and the metal layer and the contact metal layer may include the same material as each other.

In an embodiment, the at least one organic material layer may include one or more selected from among a hole transport layer, a hole injection layer, an electron injection layer, and an electron transport layer.

In an embodiment, the at least one groove may include: a first hole penetrating through the metal layer; a second hole penetrating through the first organic insulating layer; and a third hole penetrating through the second organic insulating layer.

In an embodiment, the display apparatus may further include: a third organic insulating layer at least partially exposing the pixel electrode; and a fourth organic insulating layer on the third organic insulating layer. The first dam portion may include at least one selected from among the first organic insulating layer, the second organic insulating layer, the third organic insulating layer, and the fourth organic insulating layer.

In an embodiment, the second dam portion may include at least one selected from among the first organic insulating layer, the second organic insulating layer, and the third organic insulating layer.

In an embodiment, an upper surface of the first dam portion may have a first height from an upper surface of the substrate, an upper surface of the second dam portion may have a second height from the upper surface of the substrate, and the second height may be less than or equal to the first height.

In an embodiment, the second dam portion may include at least one selected from among the first organic insulating layer, the second organic insulating layer, the third organic insulating layer, and the fourth organic insulating layer.

In an embodiment, an upper surface of the first dam portion may have a first height from an upper surface of the substrate, an upper surface of the second dam portion may have a third height from the upper surface of the substrate, and the third height may be less than or equal to the first height.

In an embodiment, the multi-layered film may include at least one lower insulating layer under the first organic insulating layer, and the at least one lower insulating layer may include an inorganic insulating layer.

In an embodiment, a bottom surface of the at least one groove may be at a virtual surface that is between an upper surface of the substrate and an upper surface of the at least one lower insulating layer.

In an embodiment, the at least one lower insulating layer may have an opening overlapping with the at least one groove.

In an embodiment, the first inorganic encapsulation layer and the second inorganic encapsulation layer may be in contact with each other on an upper surface of the first dam portion.

In an embodiment, the display apparatus may further include an input sensing layer on the thin-film encapsulation layer, the input sensing layer including an insulating layer and at least one conductive layer that includes a sensing electrode or a trace line.

In an embodiment, the input sensing layer may include: a first insulating layer on the thin-film encapsulation layer; a first conductive layer on the first insulating layer at the second area; a second insulating layer covering the first conductive layer; a second conductive layer on the second insulating layer at the second area; and a third insulating layer covering the second conductive layer.

In an embodiment, at least a portion of the first insulating layer, at least a portion of the second insulating layer, and at least a portion of the third insulating layer may be at the third area.

In an embodiment, the display apparatus may further include: a planarization layer at the third area, the planarization layer being between the first insulating layer and the second insulating layer; and a cover layer on the second insulating layer.

In an embodiment, the at least one groove may have an undercut structure.

According to one or more embodiments of the present disclosure, a display apparatus includes: a substrate including a first area, a second area, and a third area between the first area and the second area, the first area having a through hole; a display element at the second area, the display element including a pixel electrode, an opposite electrode, and an intermediate layer between the pixel electrode and the opposite electrode, and the intermediate layer including at least one organic material layer; a thin-film encapsulation layer covering the display element, and including a first inorganic encapsulation layer, a second inorganic encapsulation layer, and an organic encapsulation layer between the first inorganic encapsulation layer and the second inorganic encapsulation layer; a first dam portion at the third area, the first dam portion being adjacent to the second area; a second dam portion at the third area, and spaced from the first dam portion; and at least one groove between the first dam portion and the second dam portion. The at least one organic material layer of the intermediate layer is disconnected by the at least one groove, and at least a portion of the organic encapsulation layer is in the at least one groove that is between the first dam portion and the second dam portion, and adjacent to the first dam portion.

In an embodiment, the display apparatus may further include a multi-layered film between the substrate and the opposite electrode, the multi-layered film including a first organic insulating layer, a second organic insulating layer, and a metal layer between the first organic insulating layer and the second organic insulating layer, and the at least one groove may be in the multi-layered film.

In an embodiment, the display apparatus may further include: a third organic insulating layer at least partially exposing the pixel electrode; and a fourth organic insulating layer on the third organic insulating layer. The first dam portion may include at least one selected from among the first organic insulating layer, the second organic insulating layer, the third organic insulating layer, and the fourth organic insulating layer.

In an embodiment, the display apparatus may further include a first auxiliary dam portion between the first dam portion and the second dam portion, and the first auxiliary dam portion may include the second organic insulating layer and the third organic insulating layer.

In an embodiment, an upper surface of the first dam portion may have a first height from an upper surface of the substrate, an upper surface of the first auxiliary dam portion may have a second height from the upper surface of the substrate, and the second height may be less than or equal to the first height.

In an embodiment, an upper surface of the first dam portion may have a first height from an upper surface of the substrate, an upper surface of the second dam portion may have a third height from the upper surface of the substrate, and the third height may be less than or equal to the first height.

In an embodiment, the display apparatus may further include an input sensing layer on the thin-film encapsulation layer, the input sensing layer including an insulating layer and at least one conductive layer that includes a sensing electrode or a trace line.

In an embodiment, the input sensing layer may include: a first insulating layer on the thin-film encapsulation layer; a first conductive layer on the first insulating layer at the second area; a second insulating layer covering the first conductive layer; a second conductive layer on the second insulating layer at the second area; and a third insulating layer covering the second conductive layer.

In an embodiment, at least a portion of the first insulating layer, at least a portion of the second insulating layer, and at least a portion of the third insulating layer may be at the third area.

In an embodiment, the display apparatus may further include: a planarization layer at the third area, the planarization layer being between the first insulating layer and the second insulating layer; and a cover layer on the second insulating layer.

Other aspects and features of the present disclosure will become better understood through the accompanying drawings, the claims, and the detailed description.

BRIEF DESCRIPTION OF THE DRAWINGS

The above and other aspects and features of the present disclosure will become more apparent to those skilled in the art from the following detailed description of the example embodiments with reference to the accompanying drawings, in which:

FIGS. 2A-2B are cross-sectional views of a display apparatus according to one or more embodiments;

DETAILED DESCRIPTION

Figure 1:
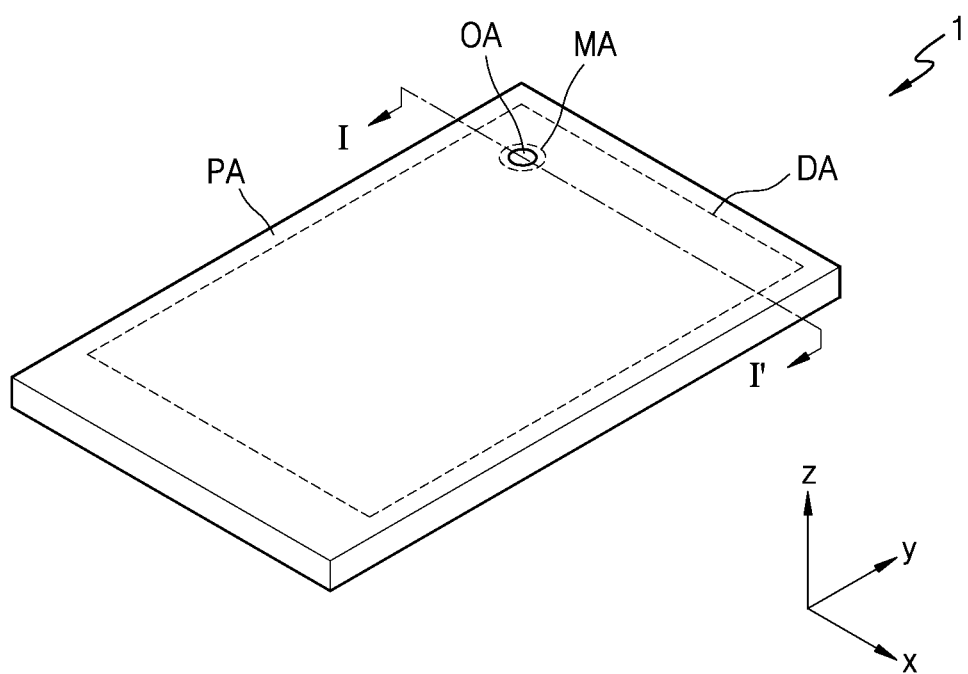
FIG. 1 is a perspective view of a display apparatus according to an embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

As used in the specification herein, a line "extending in a first direction or a second direction" denotes extending in the first direction or the second direction in a zig-zag shape or in a curve, as well as extending straight or substantially straight in the first direction or the second direction.

Throughout the specification, the phrase "in a plan view" denotes a view of a target portion from the top, and the phrase "in a cross-sectional view" denotes a view of a cross-section of the target portion that is vertically cut from a lateral direction. Throughout the specification, the expression "overlap" includes overlapping "in a plan view" and overlapping "in a cross-sectional view".

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view of a display apparatus 1 according to an embodiment.

Referring to FIG. 1, the display apparatus 1 includes a first area OA, and a display area DA that is a second area that at least partially surrounds (e.g., around a periphery of) the first area OA. The display apparatus 1 may provide a desired image (e.g., a predetermined image) via light emitted from a plurality of pixels arranged at (e.g., in or on) the display area DA. FIG. 1 shows that one first area OA is at (e.g., in or on) the display area DA, and the one first area OA is entirely surrounded (e.g., around a periphery thereof) by the display area DA, but the present disclosure is not limited thereto. The first area OA may be an area at (e.g., in or on) which a component, which will be described in more detail below with reference to FIG. 2A, is arranged.

A middle area MA as a third area is between the first area OA and the display area DA (e.g., the second area), and the display area DA may be surrounded (e.g., around a periphery thereof) by a peripheral area PA that is a fourth area. The middle area MA and the peripheral area PA may be non-display areas at (e.g., in or on) which pixels are not arranged. The middle area MA may be entirely surrounded (e.g., around a periphery thereof) by the display area DA, and the display area DA may be entirely surrounded (e.g., around a periphery thereof) by the peripheral area PA.

Hereinafter, for convenience, the display apparatus 1 is described in more detail in the context of an organic light-emitting display apparatus according to an embodiment, but the present disclosure is not limited thereto. For example, in another embodiment, a quantum dot light-emitting display may be used as the display apparatus 1.

FIG. 1 shows that one first area OA having a circular shape is provided, but the present disclosure is not limited thereto. For example, in other embodiments, two or more first areas OA may be provided, and each of the first areas OA may have various suitable shapes, such as a circular shape, an elliptical shape, a polygonal shape, a star-like shape, a diamond shape, and/or the like.

Figure 2B:
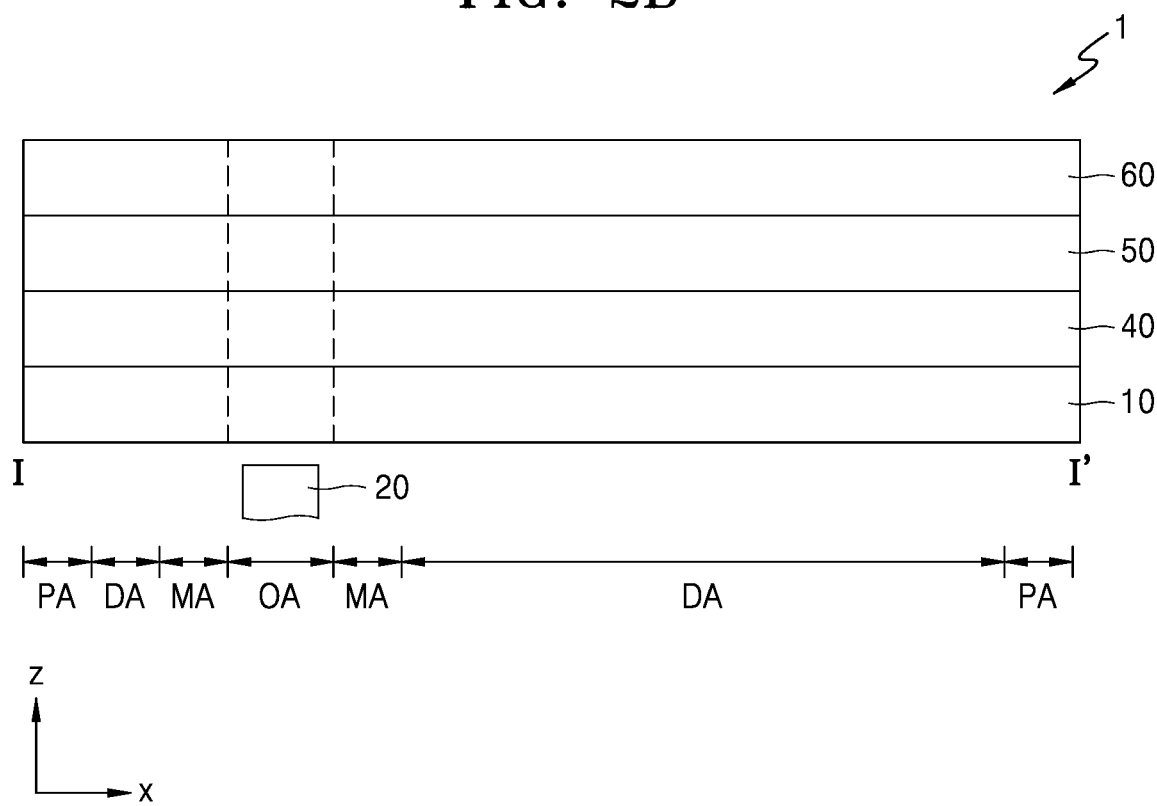

FIGS. 2A and 2B are cross-sectional views of the display apparatus 1, according to one or more embodiments, taken along the line I-I' of FIG. 1.

Referring to FIG. 2A, the display apparatus 1 includes a display panel 10, an input sensing layer 40 on the display panel 10, and an optical functional layer 50, which may be covered by a window 60. The display apparatus 1 may include (e.g., may be implemented as part of) various suitable electronic devices, for example, such as a mobile phone, a laptop computer, a smart watch, and/or the like.

The display panel 10 may display images. The display panel 10 includes the pixels arranged at (e.g., in or on) the display area DA. Each of the pixels may include a display element, and a pixel circuit connected to the display element. The display element may include an organic light-emitting diode, a quantum-dot organic light-emitting diode, or the like.

The input sensing layer 40 obtains coordinate information generated according to an external input (e.g., a touch event). The input sensing layer 40 may include a sensing electrode (or a touch electrode), and trace lines connected to the sensing electrode. The input sensing layer 40 may be arranged on the display panel 10. The input sensing layer 40 may sense the external input by a mutual capacitance method and/or a self-capacitance method.

The input sensing layer 40 may be directly arranged on the display panel 10, or may be separately formed and then bonded to the display panel 10 via an adhesive layer, for example, such as an optical clear adhesive. For example, the input sensing layer 40 may be successively formed after a process of forming the display panel 10. In this case, the input sensing layer 40 may be understood as a part of the display panel 10, and the adhesive layer may not be provided between the input sensing layer 40 and the display panel 10. FIG. 2A shows that the input sensing layer 40 is arranged between the display panel 10 and the optical functional layer 50, but the present disclosure is not limited thereto, and in another embodiment, the input sensing layer 40 may be arranged on the optical functional layer 50.

The optical functional layer 50 may include an anti-reflection layer. The anti-reflection layer may reduce a reflectivity of light (e.g., external light) incident to the display panel 10 from the outside via the window 60. The anti-reflection layer may include a retarder and a polarizer. The retarder may be of a film type or a liquid crystal coating type, and may include a half-wave (A/2) retarder and/or a quarter-wave (A/4) retarder. The polarizer may be of a film type or a liquid crystal coating type. The film-type polarizer may include a stretched synthetic resin film, and the liquid crystal coating-type polarizer may include liquid crystals that are arranged in a suitable orientation (e.g., a predetermined orientation). The retarder and the polarizer may further include a protective film. The protective film of the retarder and the polarizer may be defined as a base layer of the anti-reflection layer.

In another embodiment, the anti-reflection layer may include a black matrix and color filters. The color filters may be arranged according to a color of light emitted from each of the pixels in the display panel 10. In another embodiment, the anti-reflection layer may include a destructive interference structure. The destructive interference structure may include a first reflective layer and a second reflective layer that arranged at (e.g., in or on) different layers from each other. First reflected light and second reflected light that are reflected by the first reflective layer and the second reflective layer, respectively, may destructively interfere with each other, and thus, a reflectivity of the external light may be reduced.

The optical functional layer 50 may include a lens layer. The lens layer may improve the light-emitting efficiency of the light emitted from the display panel 10, or may reduce a color difference. The lens layer may include a layer having a concave or a convex lens shape, and/or may include a plurality of layers having different refractive indices from one another. The optical functional layer 50 may include both the anti-reflection layer and the lens layer, or may include either one of the anti-reflection layer or the lens layer. In other words, the optical functional layer 50 may include at least one of the anti-reflection layer or the lens layer.

In an embodiment, the optical functional layer 50 may be successively formed after the process of forming the display panel 10, and/or the input sensing layer 40. In this case, the adhesive layer may not be provided between the optical functional layer 50 and the display panel 10, and/or between the optical functional layer 50 and the input sensing layer 40.

The display panel 10, the input sensing layer 40, and/or the optical functional layer 50 may each include an opening (e.g., a hole or a through-hole). In this regard, FIG. 2A shows that the display panel 10, the input sensing layer 40, and the optical functional layer 50 include first to third openings 10H, 40H, and 50H, respectively, that overlap with one another. The first to third openings 10H, 40H, and 50H may be located to correspond to the first area OA. In another embodiment, one or more of the display panel 10, the input sensing layer 40, and the optical functional layer 50 may not include the opening. For example, one or two elements selected from among the display panel 10, the input sensing layer 40, and the optical functional layer 50 may not include the opening. As another example, each of the display panel 10, the input sensing layer 40, and the optical functional layer 50 may not include the opening, for example, as shown in FIG. 2B.

The first area OA may be a kind of component area (e.g., a sensor region, a camera region, a speaker region, and/or the like) at (e.g., in or on) which a component 20 for adding various suitable functions to the display apparatus 1 is located. For example, the component 20 may be located in the first to third openings 10H, 40H, and 50H as shown in FIG. 2A. As another example, the component 20 may be located under (e.g., underneath) the display panel 10 as shown in FIG. 2B.

The component 20 may include an electronic element. For example, the component 20 may be an electronic element that uses light or sound. For example, the electronic element may include a sensor for outputting and/or for receiving light such as an infrared-ray sensor, a camera for capturing an image by receiving light, a sensor for outputting and for sensing light or sound to measure a distance or to recognize a fingerprint, a small-sized lamp for illuminating light, a speaker for outputting sound, and/or the like. The electronic element that uses light may use light of various suitable wavelength bands, for example, such as visible light, infra-red-ray light, ultraviolet rays, and/or the like. In some embodiments, the first area OA may be considered as a transmission area through which light and/or sound output from the component 20 or proceeding towards the electronic element from the outside may pass.

In another embodiment, when the display apparatus 1 is used in a smart watch or an instrument panel for a vehicle, the component 20 may include a member having a clock needle, or a needle indicating various desired information (e.g., predetermined information), for example, such as vehicle velocity, and/or the like. When the display apparatus 1 includes the clock needle or the instrument panel for the vehicle, the component 20 may be exposed to the outside after penetrating through the window 60, and in this case, the window 60 may include an opening corresponding to the first area OA.

The component 20 may include one or more elements related to various functions of the display panel 10 as described above, or may include one or more elements, for example, such as an accessory for increasing an aesthetic sense of the display panel 10. Although not shown in FIGS. 2A and 2B, an optical clear adhesive and/or the like may be between the window 60 and the optical functional layer 50.

FIGS. 3A to 3D are cross-sectional views of a display apparatus according to one or more embodiments.

Figure 3A:
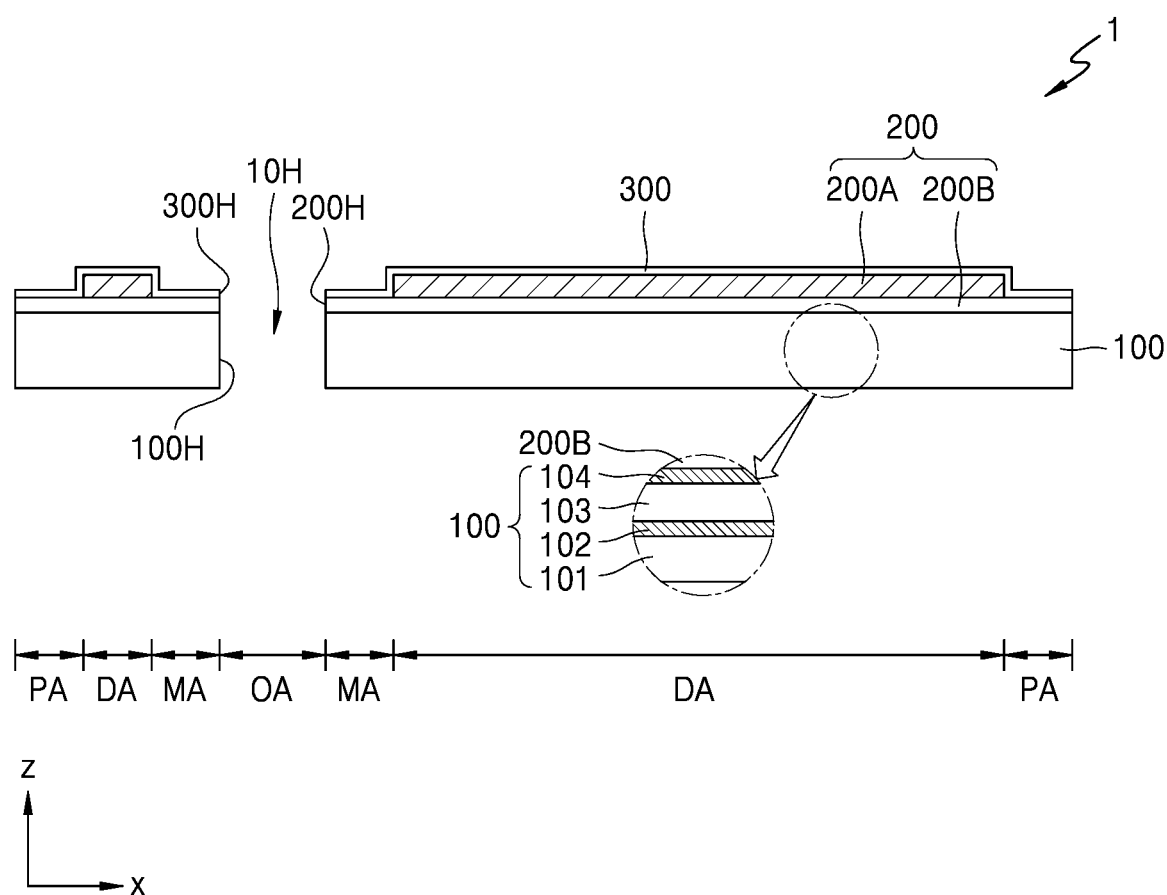
FIGS. 3A-3D are cross-sectional views of a display apparatus according to one or more embodiments.

Referring to FIG. 3A, the display apparatus 1 may include a display layer 200 on a substrate 100. The substrate 100 may include glass or a polymer resin. The substrate 100 may have a multi-layered structure. For example, as shown in an enlarged view in FIG. 3A, the substrate 100 may include a first base layer 101, a first barrier layer 102, a second base layer 103, and a second barrier layer 104.

The first and second base layers 101 and 103 may each include a polymer resin. For example, the first and second base layers 101 and 103 may each include a polymer resin, for example, such as polyether sulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), cellulose triacetate (TAC), cellulose acetate propionate (CAP), and/or the like. The above described polymer resin may be transparent.

The first barrier layer 102 and the second barrier layer 104 are barrier layers for preventing or substantially preventing the infiltration of external impurities, and may each have a single-layer structure or a multi-layered structure including an inorganic material, for example, such as silicon nitride ($SiN_x$, x>0), silicon oxynitride (SiON), and/or silicon oxide ($SiO_x$, x>0).

The display layer 200 may include a plurality of pixels. The display layer 200 may include a display element layer 200A, and a pixel circuit layer 200B. The display element layer 200A includes a display element in each pixel, and the pixel circuit layer 200B includes a pixel circuit and insulating layers in each pixel. Each pixel circuit may include a thin-film transistor and a storage capacitor, and each display element may include an organic light-emitting diode OLED.

The display elements in the display layer 200 may be covered by an encapsulation member, for example, such as a thin-film encapsulation layer 300. The thin-film encapsulation layer 300 may include at least one inorganic encapsulation layer, and at least one organic encapsulation layer. When the display apparatus 1 includes the substrate 100 including the polymer resin, and the thin-film encapsulation layer 300 including the at least one inorganic encapsulation layer and the at least one organic encapsulation layer, flexibility of the display apparatus 1 may be improved.

The display apparatus 1 may include the first opening 10H penetrating through the display panel. The first opening 10H may be in the first area OA, and in this case, the first area OA may be an opening area. FIG. 3A shows that the substrate 100 and the thin-film encapsulation layer 300 include through holes 100H and 300H, respectively, that correspond to the first opening 10H of the display panel. The display layer 200 may also include a through hole 200H corresponding to the first area OA.

Figure 3B:
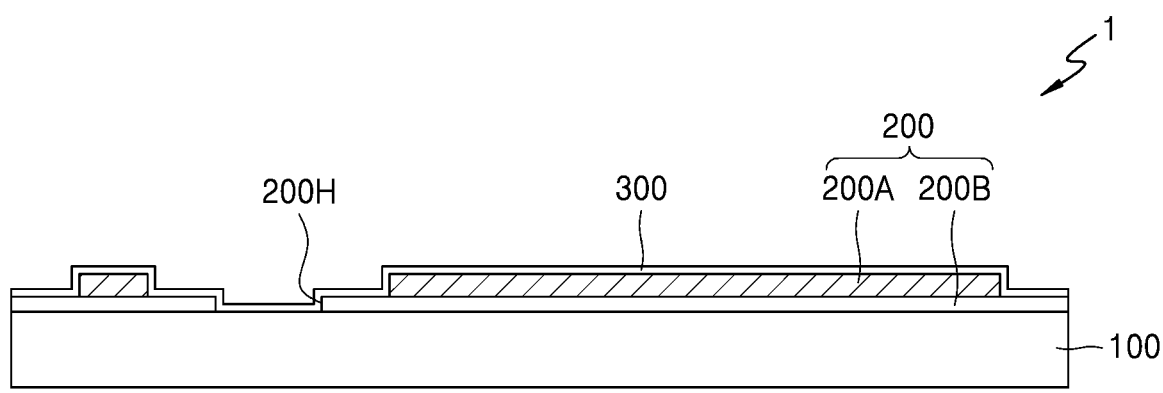
Figure 3B:
Figure 3B:
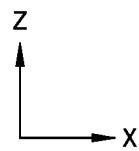

In another embodiment, as shown in FIG. 3B, the substrate 100 may not include a through hole corresponding to the first area OA. The display layer 200 may include a through hole 200H corresponding to the first area OA. The thin-film encapsulation layer 300 may not include a through hole corresponding to the first area OA.

Figure 3C:
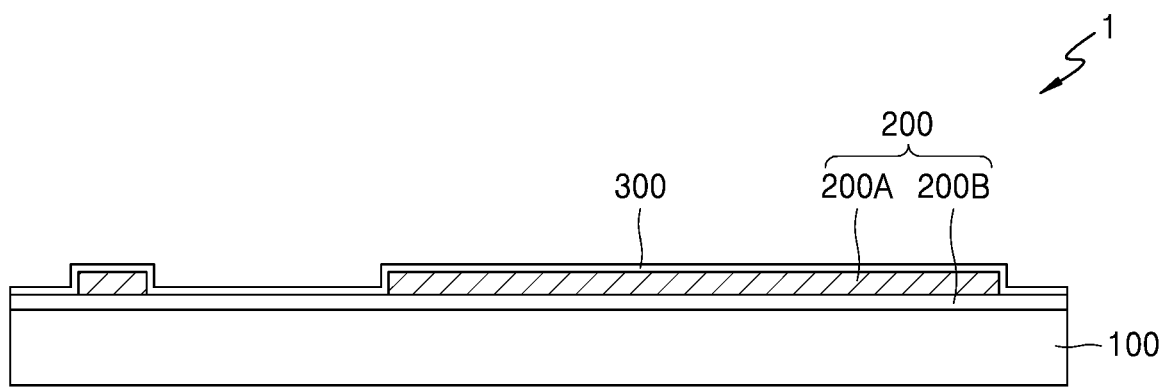

In another embodiment, as shown in FIG. 3C, the display layer 200 may not include the through hole 200H corresponding to the first area OA, and the display element layer 200A may not be located at (e.g., in or on) the first area OA.

Figure 3D:
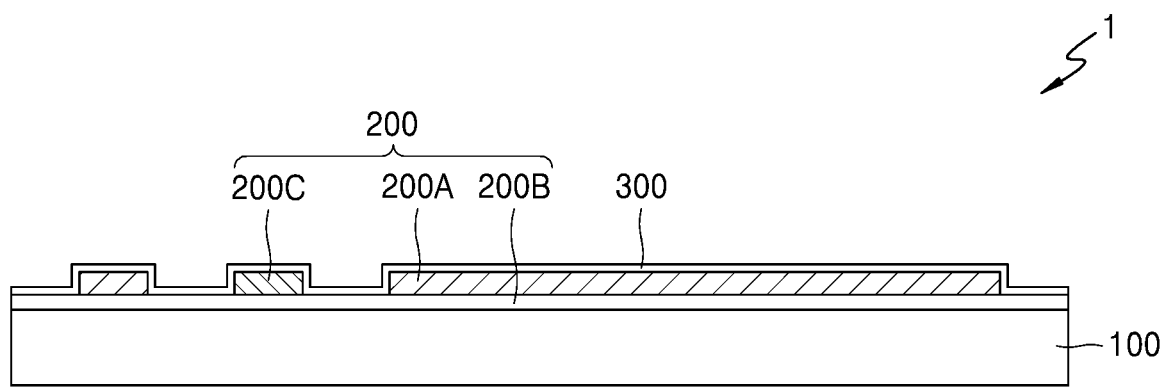
Figure 3D:
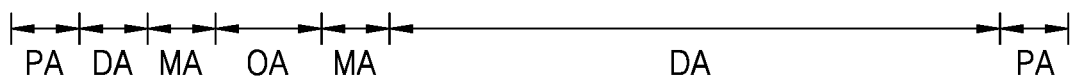
Figure 3D:
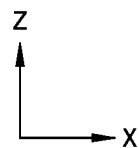

FIGS. 3A to 3C show that the display element layer 200A is not at (e.g., in or on) the first area OA, but the present disclosure is not limited thereto. For example, in another embodiment, as shown in FIG. 3D, an auxiliary display element layer 200C may be at (e.g., in or on) the first area OA. The auxiliary display element layer 200C may include a display element that has a different structure and/or operates in a different manner from those of the display element in the display element layer 200A.

In an embodiment, each of the pixels in the display element layer 200A may include an active organic light-emitting diode, and the auxiliary display element layer 200C may include pixels, each of which includes a passive organic light-emitting diode. When the auxiliary display element layer 200C includes the display element of the passive organic light-emitting diode, components of the pixel circuit may not be located under (e.g., underneath) the passive organic light-emitting diode. For example, in the pixel circuit layer 200B, a portion under (e.g., underneath) the auxiliary display element layer 200C may not include a thin-film transistor and a storage capacitor.

In another embodiment, the auxiliary display element layer 200C may include a display element of the same or substantially the same kind (e.g., the active organic light-emitting diode) as that of the display element layer 200A, but may have the pixel circuit having a different structure thereunder. For example, the pixel circuit under (e.g., underneath) the auxiliary display element layer 200C (e.g., the pixel circuit including a light blocking layer between the substrate 100 and the thin-film transistor, and/or the like) may have a different structure from that of the pixel circuit under (e.g., underneath) the display element layer 200A. As another example, the display elements of the auxiliary display element layer 200C may be operated according to different control signals from those operating the display elements in the display element layer 200A. At (e.g., in or on) the first area OA in which the auxiliary display element layer 200C is located, a component (e.g., an infrared ray sensor, and/or the like) that does not use a relatively high transmittance may be arranged. In this case, the first area OA may be understood as a component area and an auxiliary display area.

FIGS. 4A to 4D are cross-sectional views of the display apparatus 1 according to one or more embodiments. Unlike that of the display apparatus 1 described above with reference to FIGS. 3A to 3D, which includes the thin-film encapsulation layer 300, the display apparatus 1 shown in FIGS. 4A to 4D may include an encapsulation substrate 300A and a sealant 340.

Figure 4A:
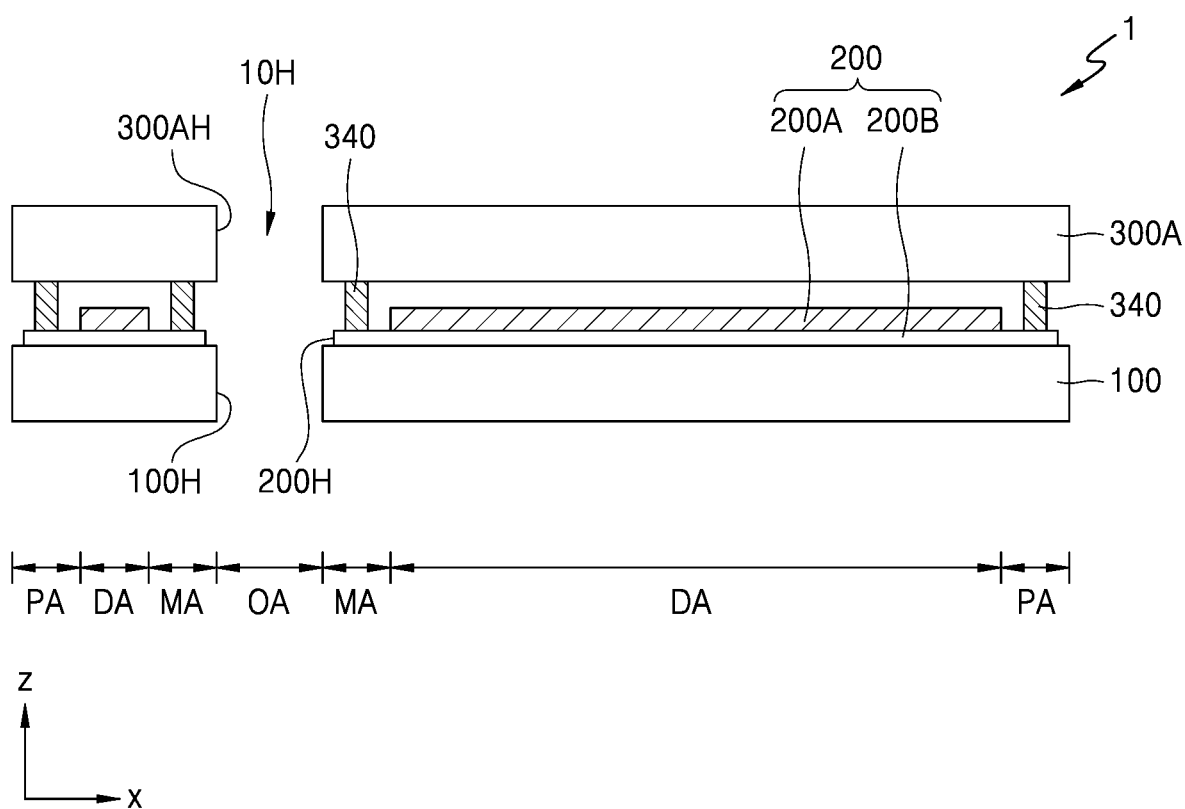
FIGS. 4A-4D are cross-sectional views of a display apparatus according to one or more embodiments.
Figure 4B:
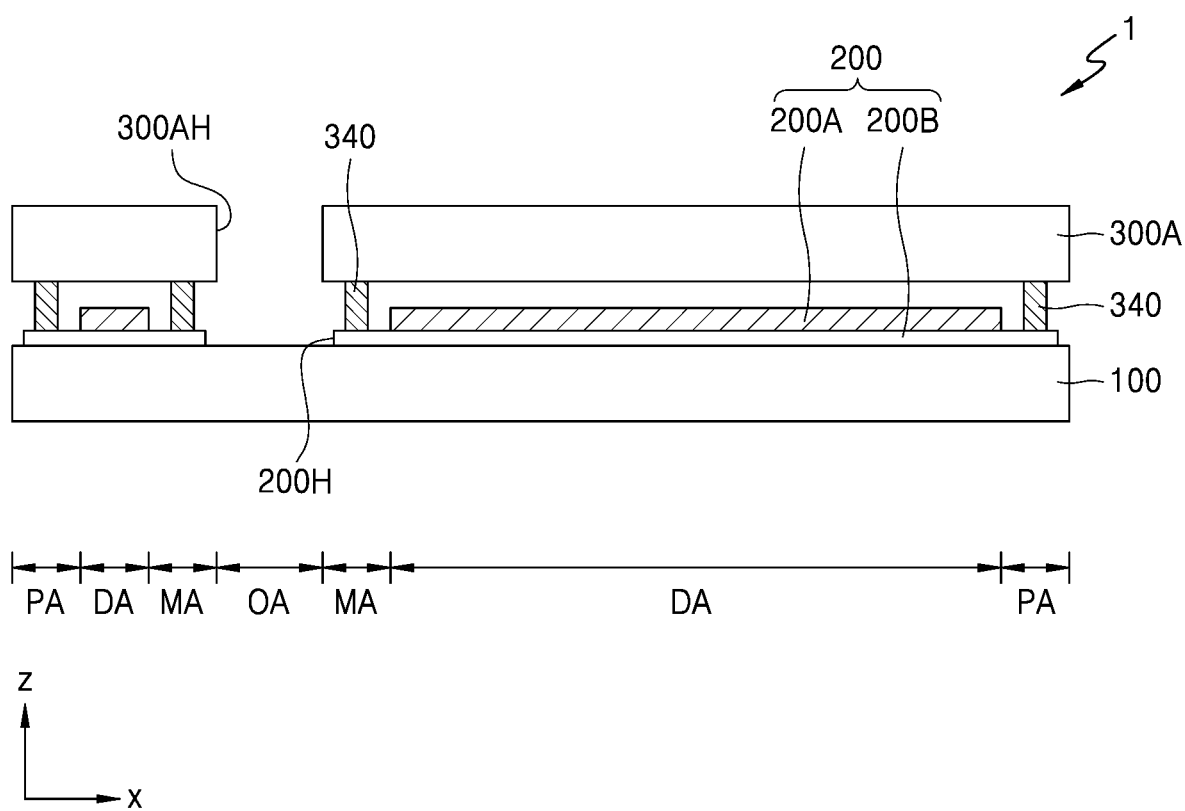
Figure 4C:
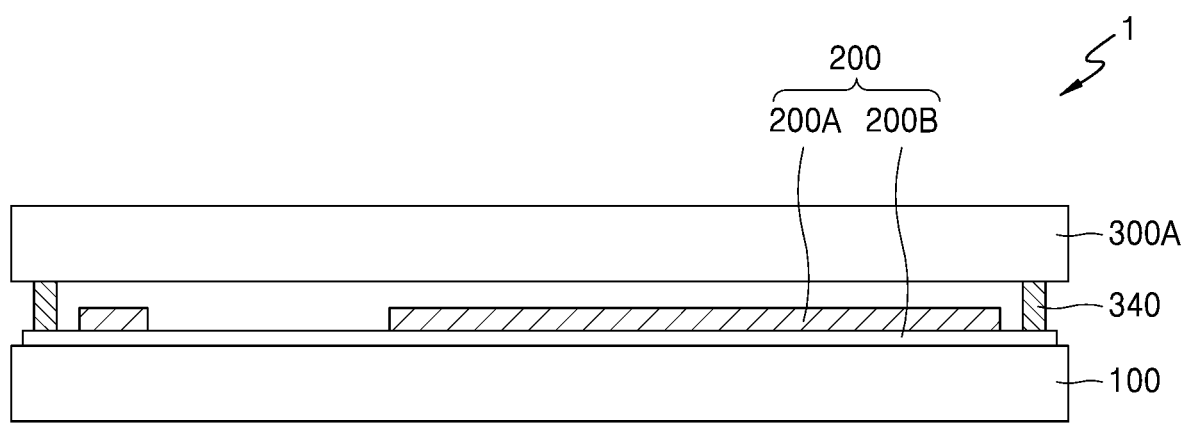
Figure 4D:
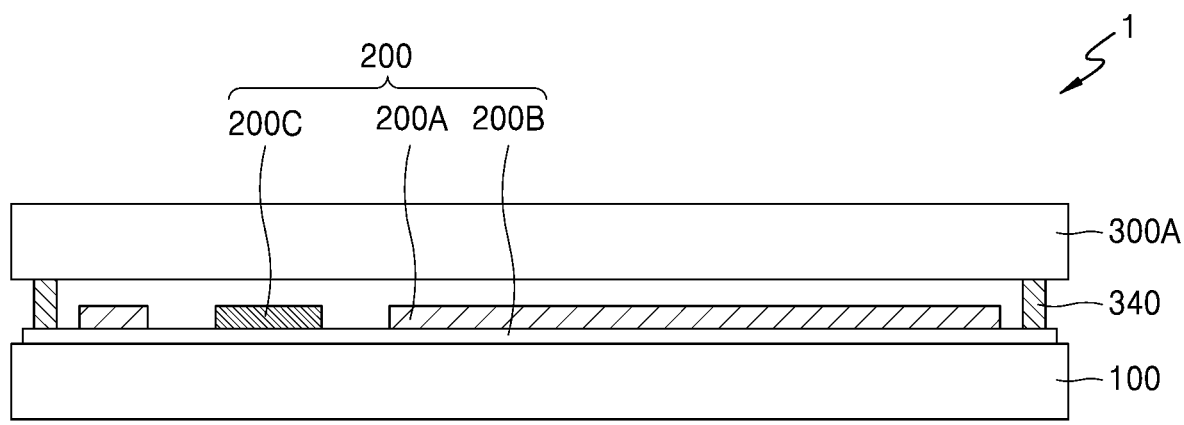

As shown in FIGS. 4A to 4C, one or more from among the substrate 100, the display layer 200, and the encapsulation substrate 300A may include the through holes 100H, 200H, and 300AH corresponding to the first area OA. The display element layer 200A may not be at (e.g., in or on) the first area OA, or the auxiliary display element layer 200C may be at (e.g., in or on) the first area OA, for example, as shown in FIG. 4D. The auxiliary display element layer 200C is described above with reference to FIG. 3D, and thus, redundant description thereof may not be repeated.

Figure 5:
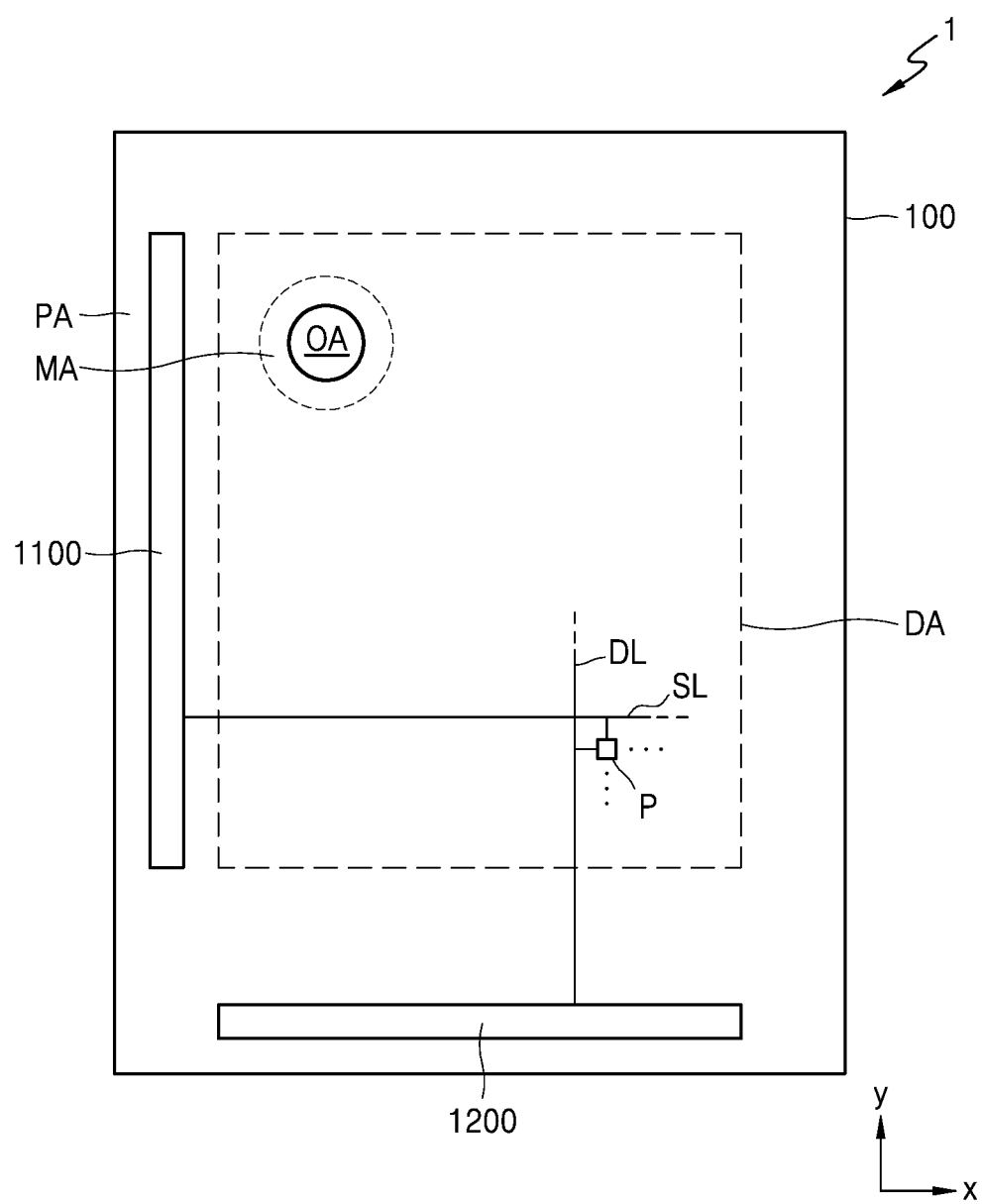
FIG. 5 is a plan view of a display apparatus according to an embodiment.
Figure 6:
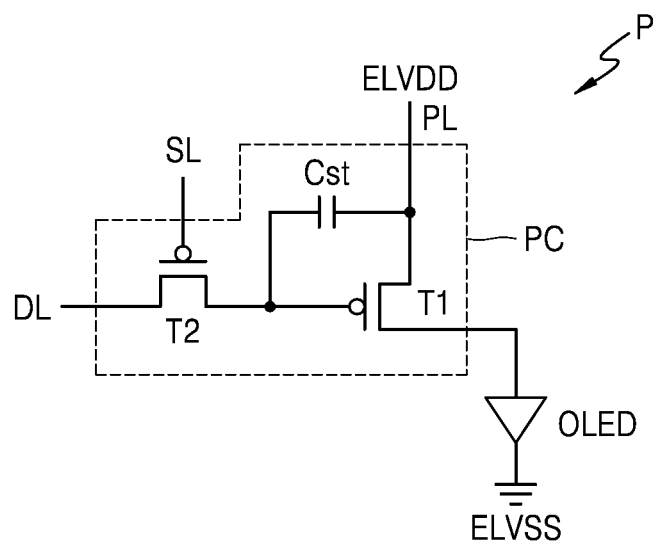
FIG. 6 is an equivalent circuit diagram of a pixel in a display apparatus according to an embodiment.

FIG. 5 is a plan view of the display apparatus 1 according to an embodiment, and FIG. 6 is an equivalent circuit diagram of a pixel in the display apparatus 1 according to an embodiment.

Referring to FIG. 5, the display apparatus 1 may include the first area OA, the display area DA that is the second area, the middle area MA that is the third area, and the peripheral area PA that is the fourth area. FIG. 5 shows the substrate 100 in the display apparatus 1. For example, it may be understood that the substrate 100 includes the first area OA, the display area DA, the middle area MA, and the peripheral area PA.

The display apparatus 1 includes a plurality of pixels P arranged at (e.g., in or on) the display area DA. Each of the pixels P may include a pixel circuit PC, and a display element connected to the pixel circuit PC. For example, the display element may be an organic light-emitting diode OLED as shown in FIG. 6. The pixel circuit PC may include a first thin-film transistor T1, a second thin-film transistor T2, and a storage capacitor Cst. Each pixel P may emit light, for example, such as a red light, a green light, or a blue light, via the organic light-emitting diode OLED, or may emit a red light, a green light, a blue light, or a white light, for example, via the organic light-emitting diode OLED.

The second thin-film transistor T2 is a switching thin-film transistor, and is connected to a scan line SL and a data line DL. The second thin-film transistor T2 may be configured to transfer a data voltage input from the data line DL to the first thin-film transistor T1 based on a switching voltage input from the scan line SL. The storage capacitor Cst is connected to the second thin-film transistor T2 and a driving voltage line PL, and may store a voltage corresponding to a difference between a voltage transferred from the second thin-film transistor T2 and a first power voltage ELVDD supplied to the driving voltage line PL.

The first thin-film transistor T1 is a driving thin-film transistor connected to the driving voltage line PL and the storage capacitor Cst, and may control a driving current flowing in the organic light-emitting diode OLED from the driving voltage line PL. The driving current may correspond to the voltage value stored in the storage capacitor Cst. The organic light-emitting diode OLED may emit light having a desired luminance (e.g., a predetermined or certain luminance) according to the driving current. An opposite electrode (e.g., a cathode) of the organic light-emitting diode OLED may receive a supply of a second power voltage ELVSS.

FIG. 6 illustrates that the pixel circuit PC includes two thin-film transistors and one storage capacitor, but the present disclosure is not limited thereto, and the number of thin-film transistors and the number of storage capacitors may vary depending on a design of the pixel circuit PC. For example, in other embodiments, the pixel circuit PC may include four or more thin-film transistors.

Referring back to FIG. 5, the middle area MA may surround (e.g., around a periphery of) the first area OA on a plane (e.g., in a plan view). The middle area MA is an area at (e.g., in or on) which the display element, for example, such as the organic light-emitting diode (OLED), for emitting light is not arranged, and signal lines for providing signals to the pixels P around (e.g., adjacent to) the first area OA may pass through (e.g., may extend along) the middle area MA. The peripheral area PA may include a scan driver 1100 for providing each pixel P with a scan signal, a data driver 1200 for providing each pixel P with a data signal, and a main power line for supplying first and second power voltages. FIG. 5 shows that the data driver 1200 is arranged to be adjacent to a side (e.g., an end) of the substrate 100, but the present disclosure is not limited thereto, and according to another embodiment, the data driver 1200 may be arranged on a flexible printed circuit board (FPCB) that is electrically connected to a pad arranged at a side of the display apparatus 1.

Figure 7:
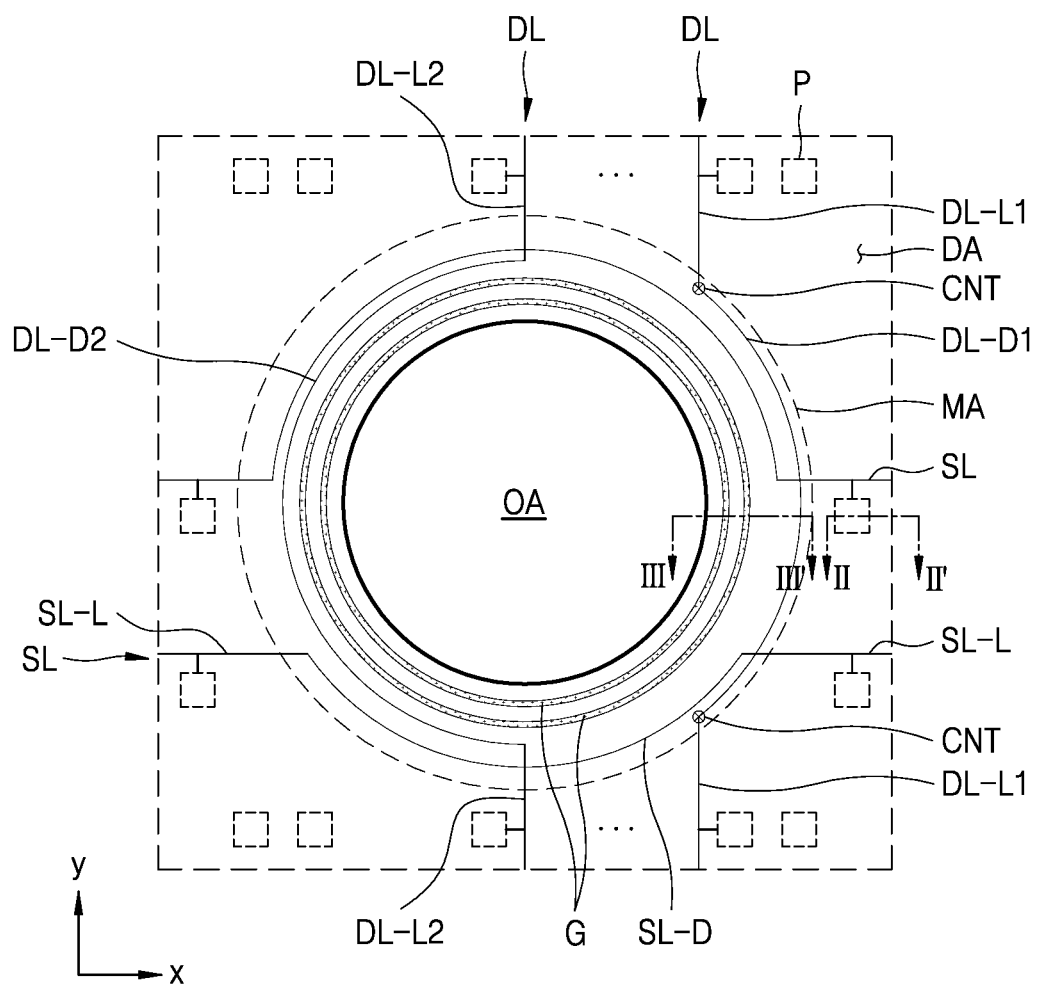
FIG. 7 is a plan view partially showing a display apparatus according to an embodiment.

FIG. 7 is a plan view partially showing a display apparatus according to an embodiment.

Referring to FIG. 7, the pixels P are at (e.g., in or on) the display area DA around (e.g., adjacent to) the first area OA. Some of the pixels P may be spaced apart from one another based on the first area OA, and the first area OA may be defined among the pixels P. For example, in the plan view of FIG. 7, the pixels P are above and under the first area OA, and at left and right sides of the first area OA.

From among the signal lines that supply signals to the pixels P, the signal lines adjacent to the first area OA may bypass the first area OA. In the plan view of FIG. 7, at least one of the data lines DL passing through (e.g., extending across) the display area DA extends in a y-axis direction to provide data signals to the pixels P arranged above and under the first area OA, and may bypass along an edge of the first area OA at (e.g., in or on) the middle area MA. In a plan view, at least one of the scan lines SL passing through (e.g., extending across) the display area DA extends in an x-direction to provide scan signals to the pixels P arranged at the left and right sides of the first area OA, and may bypass along (e.g., may arch along) the edge of the first area OA at (e.g., in or on) the middle area MA.

A bypass portion (e.g., a circuitous portion or a detouring portion) SL-D of the scan line SL may be at (e.g., in or on) the same layer as that of an extending portion SL-L of the scan line SL crossing the display area DA, and may be integrally formed with the extending portion SL-L. A bypass portion DL-D1 of at least one data line DL from among the data lines DL may be at (e.g., in or on) a different layer from that of an extending portion DL-L1 of the at least one data line DL crossing the display area DA, and the bypass portion DL-D1 and the extending portion DL-L1 of the data line DL may be connected to each other via a contact hole CNT. In FIG. 7, the contact hole CNT for connecting the bypass portion DL-D1 and the extending portion DL-L1 of the data line DL to each other is shown as being defined in the middle area MA, but the present disclosure is not limited thereto, and the contact hole CNT for connecting the bypass portion DL-D1 and the extending portion DL-L1 of the data line DL to each other may be defined at (e.g., in or on) the display area DA. A bypass portion DL-D2 of at least one of the data lines DL may be at (e.g., in or on) the same layer as that of an extending portion DL-L2 thereof, and may be integrally formed with the extending portion DL-L2.

One or more grooves G may be between the first area OA and a region where the scan lines SL and the data lines DL bypass at (e.g., in or on) the middle area MA. The grooves G may each have a loop shape surrounding (e.g., around a periphery of) the first area OA in a plan view, and may be spaced apart from one another.

Figure 8:
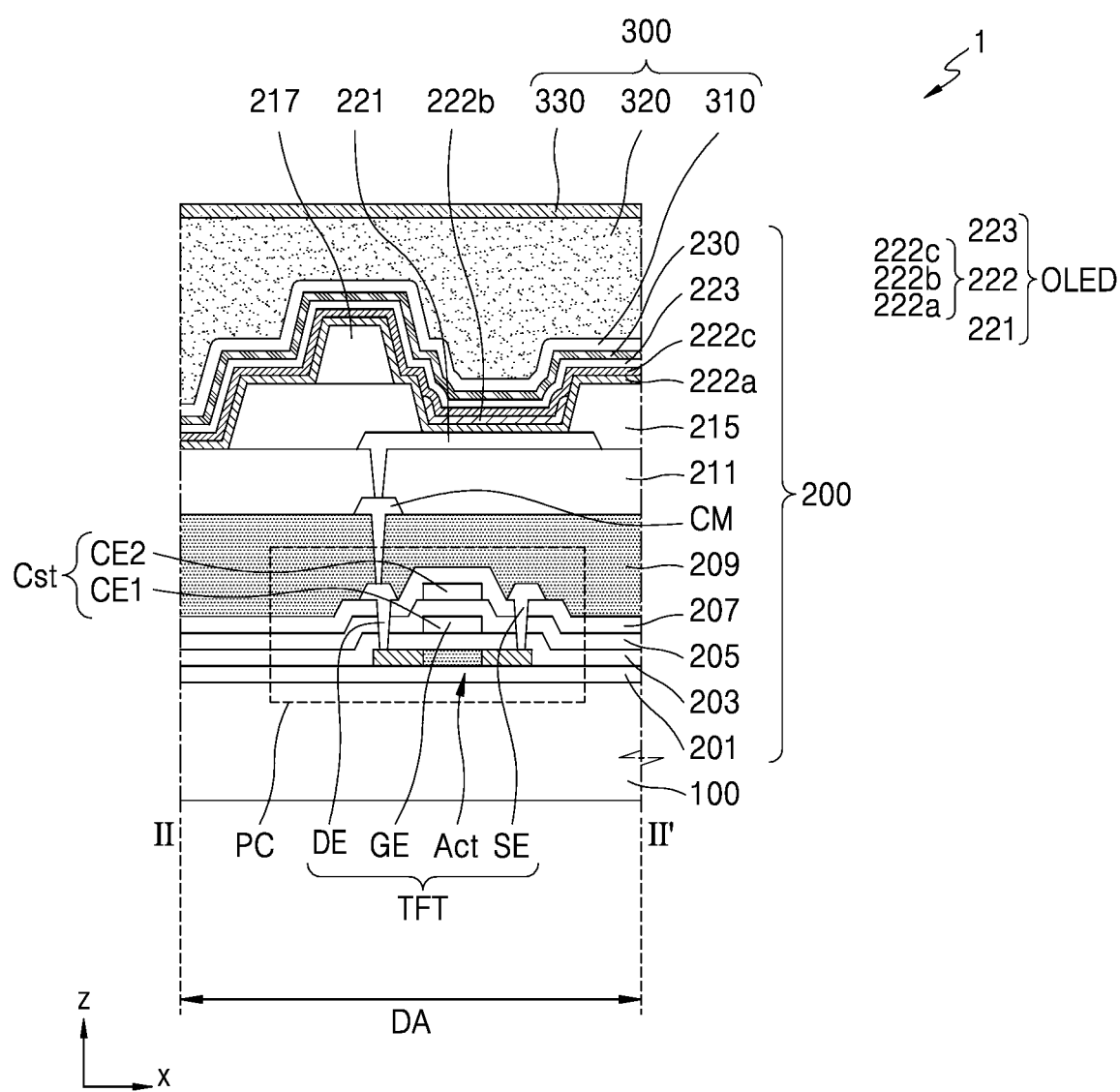
FIG. 8 is a cross-sectional view of a display apparatus according to an embodiment.

FIG. 8 is a cross-sectional view of the display apparatus 1 according to an embodiment. FIG. 8 shows a cross-sectional view taken along the line II-II' of FIG. 7.

Referring to FIG. 8, the substrate 100 may include a glass material or a polymer resin. In an embodiment, the substrate 100 may include a plurality of sub-layers, for example, as shown in the enlarged portion view in FIG. 3A.

A buffer layer 201 may be on the substrate 100 in order to prevent or substantially prevent impurities from infiltrating into a semiconductor layer Act of the thin-film transistor TFT. The buffer layer 201 may include an inorganic insulating material, for example, such as silicon nitride, silicon oxynitride, and/or silicon oxide, and may have a single-layer structure or a multi-layered structure including one or more of the inorganic insulating materials described above.

The pixel circuit PC may be on the buffer layer 201. The pixel circuit PC may include the thin-film transistor TFT, and a storage capacitor Cst. The thin-film transistor TFT may include the semiconductor layer Act, a gate electrode GE, a source electrode SE, and a drain electrode DE. The thin-film transistor TFT shown in FIG. 8 may correspond to the driving thin-film transistor (e.g., the first thin-film transistor T1) described above with reference to FIG. 6. In the present embodiment, a top gate-type transistor in which the gate electrode GE is over the semiconductor layer Act with a gate insulating layer 203 therebetween is shown, but the present disclosure is not limited thereto, and in another embodiment, the thin-film transistor TFT may be a bottom gate-type transistor.

The semiconductor layer Act may include, for example, polysilicon. As some other examples, the semiconductor layer Act may include amorphous silicon, an oxide semiconductor, an organic semiconductor, and/or the like. The gate electrode GE may include a low-resistive metal material. The gate electrode GE may include a conductive material including molybdenum (Mo), aluminum (Al), copper (Cu), titanium (Ti), and/or the like, and may have a single-layer structure or a multi-layered structure.

The gate insulating layer 203 between the semiconductor layer Act and the gate electrode GE may include an inorganic insulating material, for example, such as silicon oxide, silicon nitride, silicon oxynitride, aluminum oxide, titanium oxide, tantalum oxide, hafnium oxide, and/or the like. The gate insulating layer 203 may have a single-layer structure or a multi-layered structure including one or more of the above materials.

The source electrode SE and the drain electrode DE may include a highly conductive material. The source electrode SE and the drain electrode DE may include a conductive material including molybdenum (Mo), aluminum (Al), copper (Cu), titanium (Ti), and/or the like, and may have a single-layer structure or a multi-layered structure including one or more of the above materials. In an embodiment, the source electrode SE, the drain electrode DE, and the data line DL may each have a multi-layered structure including a titanium layer, an aluminum layer, and a titanium layer (Ti/Al/Ti).

The storage capacitor Cst may include a lower electrode CE1, and an upper electrode CE2 overlapping with the lower electrode CE1 with a first interlayer insulating layer 205 therebetween. The storage capacitor Cst may overlap with the thin-film transistor TFT. For example, FIG. 8 shows a structure in which the gate electrode GE of the thin-film transistor TFT is the lower electrode CE1 of the storage capacitor Cst. In another embodiment, the storage capacitor Cst may not overlap with the thin-film transistor TFT. The storage capacitor Cst may be covered by a second interlayer insulating layer 207. The upper electrode CE2 of the storage capacitor Cst may include a conductive material, for example, such as molybdenum (Mo), aluminum (Al), copper (Cu), titanium (Ti), and/or the like, and may have a single-layer structure or a multi-layered structure including one or more of the materials described above.

The first interlayer insulating layer 205 and the second interlayer insulating layer 207 may each include an inorganic insulating material, for example, such as silicon oxide, silicon nitride, silicon oxynitride, aluminum oxide, titanium oxide, tantalum oxide, hafnium oxide, and/or the like. The first interlayer insulating layer 205 and the second interlayer insulating layer 207 may each have a single-layer structure or a multi-layered structure including one or more of the above-mentioned materials.

The pixel circuit PC including the thin-film transistor TFT and the storage capacitor Cst may be covered by a first organic insulating layer 209. The first organic insulating layer 209 may have a flat or substantially flat upper surface.

The pixel circuit PC may be electrically connected to a pixel electrode 221. For example, as shown in FIG. 8, a contact metal layer CM may be between the thin-film transistor TFT and the pixel electrode 221. The contact metal layer CM may be connected to the thin-film transistor TFT via a contact hole in (e.g., penetrating) the first organic insulating layer 209. The pixel electrode 221 may be connected to the contact metal layer CM via a contact hole in (e.g., penetrating) a second organic insulating layer 211 that is on the contact metal layer CM. The contact metal layer CM may include a conductive material including molybdenum (Mo), aluminum (Al), copper (Cu), titanium (Ti), and/or the like, and may have a single-layer structure or a multi-layered structure. In an embodiment, the contact metal layer CM may have a multi-layered structure including Ti/Al/Ti.

The first organic insulating layer 209 and the second organic insulating layer 211 may include an organic insulating material, for example, such as a general universal polymer (e.g., polymethylmethacrylate (PMMA) or polystyrene (PS)), polymer derivatives having phenol groups, acryl-based polymer, imide-based polymer, aryl ether-based polymer, amide-based polymer, fluoride-based polymer, p-xylene-based polymer, vinyl alcohol-based polymer, and/or blends thereof. In an embodiment, the first organic insulating layer 209 and the second organic insulating layer 211 may include polyimide.

The pixel electrode 221 may be on the second organic insulating layer 211. The pixel electrode 221 may include a conductive oxide, for example, such as indium tin oxide (ITO), indium zinc oxide (IZO), zinc oxide (ZnO), indium oxide ($In_2O_3$), indium gallium oxide, or aluminum zinc oxide (AZO). In another embodiment, the pixel electrode 221 may include a reflective layer including argentum (Ag), magnesium (Mg), aluminum (Al), platinum (Pt), palladium (Pd), *aurum* (Au), nickel (Ni), neodymium (Nd), iridium (Ir), chrome (Cr), or a compound thereof. In another embodiment, the pixel electrode 221 may further include a layer including ITO, IZO, ZnO, or $In_2O_3$ on and/or under the reflective layer.

A third organic insulating layer 215 may be on the pixel electrode 221. The third organic insulating layer 215 may be a pixel defining layer for defining a light-emitting area of the pixel. The third organic insulating layer 215 may include an opening that at least partially exposes an upper surface of the pixel electrode 221, and may cover edges of the pixel electrode 221. The third organic insulating layer 215 may include, for example, an organic insulating material. As another example, the third organic insulating layer 215 may include an inorganic insulating material, for example, such as silicon nitride (SiNx), silicon oxynitride (SiON), or silicon oxide (SiOx). As another example, the third organic insulating layer 215 may include an organic insulating material and an inorganic insulating material.

An intermediate layer 222 may include an emission layer 222b. The intermediate layer 222 may include a first functional layer 222a under (e.g., underneath) the emission layer 222b, and/or a second functional layer 222c on (e.g., above) the emission layer 222b. The emission layer 222b may include a polymer or a low-molecular weight organic material for emitting a suitable colored light (e.g., a predetermined colored light).

The first functional layer 222a may have a single-layer structure or a multi-layered structure. For example, when the first functional layer 222a includes a polymer material, for example, such as poly-(3,4)-ethylene-dihydroxy thiophene (PEDOT) or polyaniline (PANI), the first functional layer 222a may include a hole transport layer (HTL) having a single-layer structure. When the first functional layer 222a includes a low-molecular weight organic material, the first functional layer 222a may include a hole injection layer (HIL) and an HTL.

The second functional layer 222c is optional according to a structure of the intermediate layer 222. For example, when the first functional layer 222a and the emission layer 222b include a polymer material, the second functional layer 222c may be formed. The second functional layer 222c may have a single-layer structure or a multi-layered structure. The second functional layer 222c may include an electron transport layer (ETL) and/or an electron injection layer (EIL).

The emission layer 222b of the intermediate layer 222 may be located at (e.g., in or on) every pixel of the display area DA. The emission layer 222b may be patterned to correspond to the pixel electrode 221. Unlike the emission layer 222b, the first functional layer 222a and/or the second functional layer 222c in the intermediate layer 222 may extend toward the middle area MA to be located at (e.g., in or on) the middle area MA, as well as at (e.g., in or on) the display area DA.

The opposite electrode 223 may include a conductive material having a low work function. For example, the opposite electrode 223 may include a (semi-) transparent layer including argentum (Ag), magnesium (Mg), aluminum (Al), platinum (Pt), palladium (Pd), aurum (Au), nickel (Ni), neodymium (Nd), iridium (Ir), chromium (Cr), lithium (Li), calcium (Ca), or an alloy thereof. As another example, the opposite electrode 223 may further include a layer including ITO, IZO, ZnO, or $In_2O_3$ on the (semi-)transparent layer including one or more of the above materials. The opposite electrode 223 may be provided on the middle area MA, as well as the display area DA. The first functional layer 222a, the second functional layer 222c, and the opposite electrode 223 may be manufactured by a thermal evaporation method.

A capping layer 230 may be on the opposite electrode 223. For example, the capping layer 230 may include LiF, and may be formed by a thermal evaporation method. In some embodiments, the capping layer 230 may be omitted.

A fourth organic insulating layer 217 may be on the third organic insulating layer 215. The fourth organic insulating layer 217 may include an organic insulating material, for example, such as polyimide. As another example, the fourth organic insulating layer 217 may include an inorganic insulating material, or an organic insulating material and an inorganic insulating material.

The fourth organic insulating layer 217 may include a material that is different from or the same as that of the third organic insulating layer 215. In an embodiment, the third organic insulating layer 215 and the fourth organic insulating layer 217 may include polyimide. The third and fourth organic insulating layers 215 and 217 may be manufactured together through a mask process using a half-tone mask.

The organic light-emitting diode OLED is covered by a thin-film encapsulation layer 300. The thin-film encapsulation layer 300 may include at least one organic encapsulation layer and at least one inorganic encapsulation layer. For example, FIG. 8 shows that the thin-film encapsulation layer 300 includes first and second inorganic encapsulation layers 310 and 330, and an organic encapsulation layer 320 between the first and second inorganic encapsulation layers 310 and 330. In another embodiment, a stacking order and/or a number of the organic and inorganic encapsulation layers may be variously modified.

The first and second inorganic encapsulation layers 310 and 330 may include one or more inorganic materials from among aluminum oxide, titanium oxide, tantalum oxide, hafnium oxide, zinc oxide, silicon oxide, silicon nitride, and silicon oxynitride. The first inorganic encapsulation layer 310 and the second inorganic encapsulation layer 330 may each have a single-layer structure or a multi-layered structure including one or more of the above-mentioned materials. The organic encapsulation layer 320 may include a polymer-based material. The polymer-based material may include an acryl-based resin, for example, such as polymethacrylate and polyacrylic acid, an epoxy-based resin, polyimide, polyethylene, and/or the like. In an embodiment, the organic encapsulation layer 320 may include an acrylate polymer.

The materials included in the first inorganic encapsulation layer 310 and the second inorganic encapsulation layer 330 may be different from each other. For example, the first inorganic encapsulation layer 310 may include silicon oxynitride, and the second inorganic encapsulation layer 330 may include silicon nitride. The first inorganic encapsulation layer 310 and the second inorganic encapsulation layer 330 may have different thicknesses from each other. For example, the thickness of the first inorganic encapsulation layer 310 may be greater than that of the second inorganic encapsulation layer 330. As another example, the thickness of the second inorganic encapsulation layer 330 may be greater than that of the first inorganic encapsulation layer 310, or the first inorganic encapsulation layer 310 and the second inorganic encapsulation layer 330 may have the same or substantially the same thickness as each other.

Figure 9:
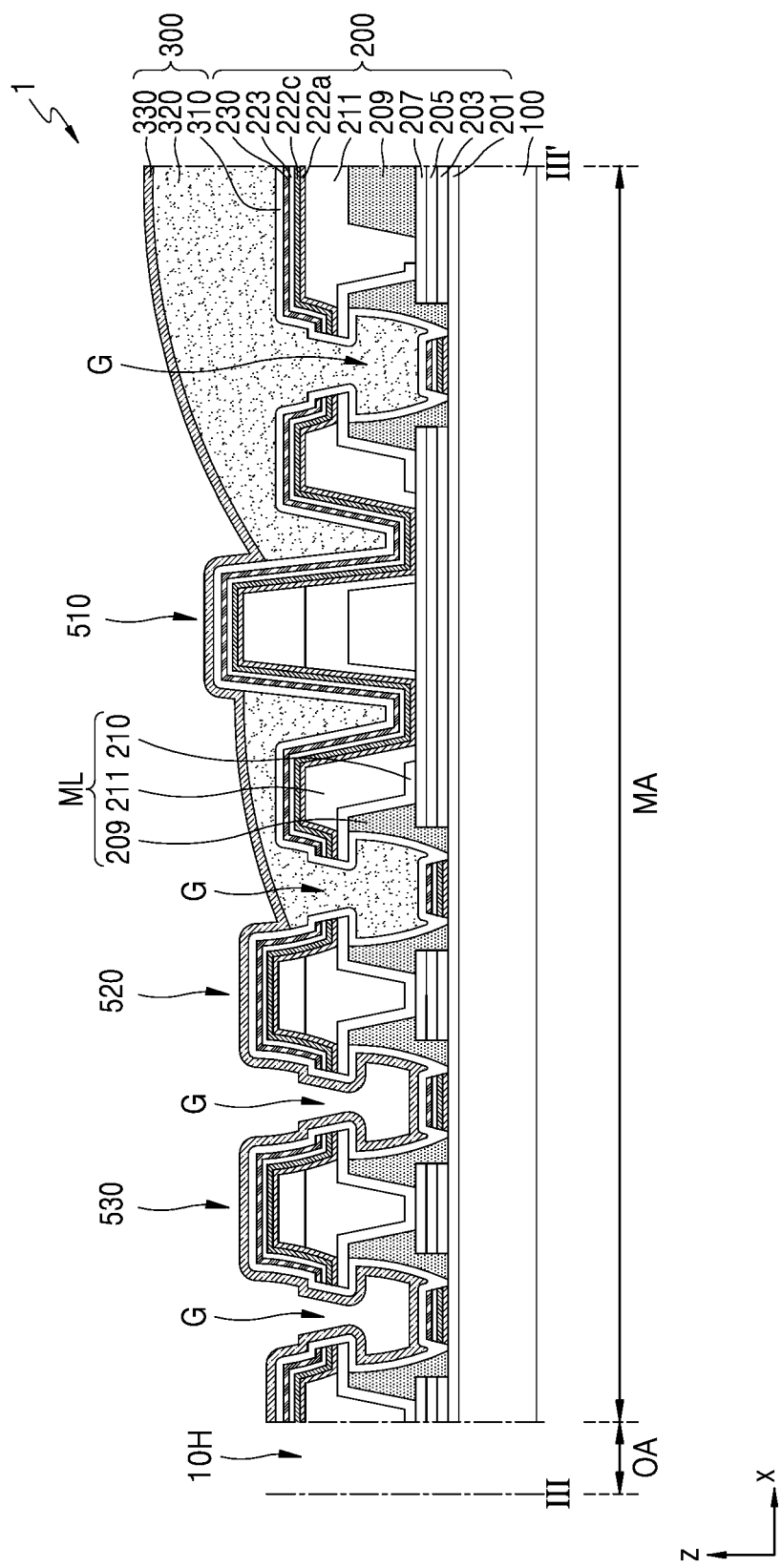
FIG. 9 is a cross-sectional view of a display apparatus according to an embodiment.

FIG. 9 is a cross-sectional view of the display apparatus 1 according to an embodiment. FIG. 9 shows a cross-sectional view taken along the line III-III' of FIG. 7.

Referring to FIG. 9, the grooves G and dam portions 510, 520, and 530 may be at (e.g., in or on) the middle area MA. The lines (e.g., the data lines DL and/or the scan lines SL shown in FIG. 7) bypassing around the first area OA may be located at (e.g., in or on) the middle area MA. For example, the lines bypassing the first area OA may be alternately arranged at (e.g., in or on) the second interlayer insulating layer 207 and the first organic insulating layer 209.

One or more grooves G may be at (e.g., in or on) the middle area MA. The organic material layer included in the intermediate layer 222, for example, in the first functional layer 222a and/or the second functional layer 222c, may be disconnected (or isolated) by the grooves G. The middle area MA may be understood as a groove area or a disconnection area (or an isolation area) of the organic material layer.

The groove G may be in a multi-layered film ML between the substrate 100 and the opposite electrode 223. The multi-layered film ML includes at least two layers including different materials from each other. The multi-layered film ML may include a first sub-layer including an organic layer, a second sub-layer including an inorganic layer (e.g., a metal layer and/or an inorganic insulating layer), and a third sub-layer including an organic layer. The groove G includes a recess or a hole formed in the first sub-layer, a hole formed in the second sub-layer, and a hole formed in the third sub-layer.

In an embodiment, FIG. 9 shows that the multi-layered film ML includes the first organic insulating layer 209 and the second organic insulating layer 211 as the organic layers, and a metal layer 210 as the inorganic layer. Here, the metal layer 210 of the multi-layered film ML may be at (e.g., in or on) the same layer (e.g., on the first organic insulating layer 209) as that of the contact metal layer CM described above with reference to FIG. 8, and may be manufactured through the same or substantially the same mask process as that of the contact metal layer CM.

The metal layer 210 and the contact metal layer CM may include the same or substantially the same material as each other. For example, the metal layer 210 may have a structure in which a titanium layer, an aluminum layer, and a titanium layer (Ti/Al/Ti) are stacked.

The dam portions 510, 520, and 530 may be located among the grooves G. The dam portions 510, 520, and 530 may include a plurality of sub-organic insulating layers that are sequentially stacked.

Figure 10:
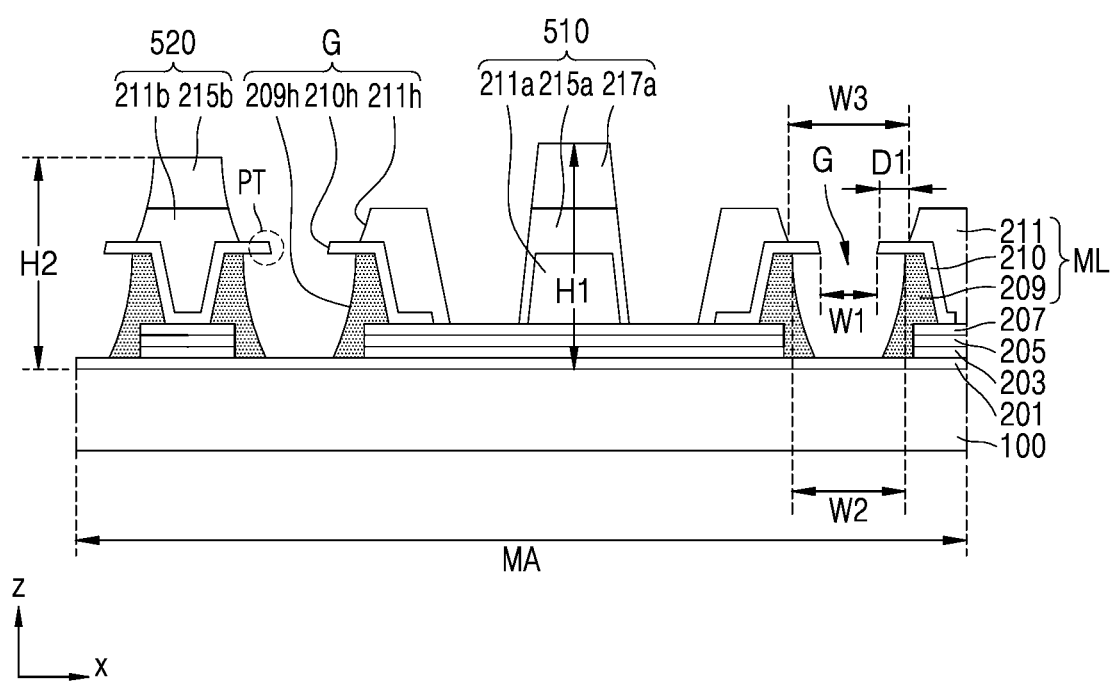
FIG. 10 is a cross-sectional view of a display apparatus according to an embodiment.

FIG. 10 is a cross-sectional view of a display apparatus according to an embodiment. In more detail, FIG. 10 is provided to describe the grooves G and the dam portions 510, 520, and 530 in the display apparatus 1 in more detail according to an embodiment, and shows a structure before the intermediate layer 222 of the organic light-emitting diode OLED is manufactured.

Referring to FIGS. 9 and 10, the grooves G of the multi-layered film ML may be manufactured prior to a process of forming the intermediate layer 222. Each groove G may have an undercut structure. The groove G may be formed by partially removing the multi-layered film ML, and the hole in the metal layer 210 has a width that is less than that of the hole (or the recess) in the first organic insulating layer 209 in order to form the groove G having the undercut structure. In an embodiment, FIG. 10 shows an example in which a first hole 210h in the metal layer 210, a second hole 209h in the first organic insulating layer 209, and a third hole 211h in the second organic insulating layer 211 overlap with one another to form the groove G. A bottom surface of the groove G may be located on a virtual surface between an upper surface of the substrate 100 and an upper surface of the first organic insulating layer 209. For example, FIG. 10 shows that the bottom surface of the groove G is located at (e.g., in, on, or over) a virtual surface that is the same or substantially the same as the upper surface of the buffer layer 201. However, the present disclosure is not limited thereto. For example, in other embodiments, the bottom surface of the groove G may be at (e.g., in or on) a virtual surface that is the same or substantially the same as the upper surface of the gate insulating layer 203, at (e.g., in or on) a virtual surface that is the same or substantially the same as the upper surface of the first interlayer insulating layer 205, or at (e.g., in or on) a virtual surface that is the same or substantially the same as the upper surface of the second interlayer insulating layer 207.

Because the bottom surface of the groove G is at (e.g., in or on) the virtual surface that is the same or substantially the same as the upper surface of the buffer layer 201 according to the embodiment shown in FIG. 10, the gate insulating layer 203, the first interlayer insulating layer 205, and the second interlayer insulating layer 207 may each include an opening or a hole overlapping with (or corresponding to) the groove G.

End portions of the metal layer 210, which define the first hole 210h, may protrude farther toward the center of the groove G as compared with an internal surface of the first organic insulating layer 209 that is under the metal layer 210. For example, a first width W1 of the first hole 210h may be less than a second width W2 of the second hole 209h, where the second width W2 of the second hole 209h is defined as a width that is immediately under the end portions of the metal layer 210 that define the first hole 210h. The end portions of the metal layer 210 protruding toward the center of the groove G and/or the first hole 210h may configure a pair of eaves (or a pair of protruding tips or tips PT). A protruding distance D1 of each tip PT may be less than a depth of the second hole 209h. For example, the protruding distance D1 of each tip PT may be about 2.0 μm or less. In an embodiment, the protruding distance D1 may be about 1 μm to about 1.5 μm.

The dam portions 510 and 520 may be located among the grooves G. For example, the dam portion 510 (e.g., a first dam portion) or an auxiliary dam portion 520 (e.g., a first auxiliary dam portion or a second dam portion) may be located among the grooves G. The first dam portion 510 may include a plurality of sub-organic insulating layers that are sequentially stacked. In an embodiment, as shown in FIG. 10, the first dam portion 510 may have a structure in which a portion 211a of the second organic insulating layer 211, a portion 215a of the third organic insulating layer 215, and a portion 217a of the fourth organic insulating layer 217 are stacked. The first auxiliary dam portion 520 may include a plurality of sub-organic insulating layers that are sequentially stacked. In an embodiment, the first auxiliary dam portion 520 may have a structure in which a portion 211b of the second organic insulating layer 211 and a portion 215b of the third organic insulating layer 215 are stacked. At least one groove G may be formed between the first dam portion 510 and the first auxiliary dam portion 520.

In an embodiment, an upper surface of the first dam portion 510 has a first height H1 from the upper surface of the substrate 100, and an upper surface of the first auxiliary dam portion 520 may have a second height H2 from the upper surface of the substrate 100. The first height H1 of the first dam portion 510 may be greater than or equal to the second height H2 of the first auxiliary dam portion 520. When the first dam portion 510 is equal to or larger than the first auxiliary dam portion 520, loss of a monomer for forming the organic encapsulation layer into a cutting line may be prevented or reduced.

The multi-layered film ML at (e.g., in or on) the middle area MA and the second organic insulating layer 211 included in the dam portions 510 and 520 may be obtained through the same or substantially the same process as each other. However, when the second organic insulating layer 211 included in the multi-layered film ML is thicker than those of the dam portions 510 and 520, an etching time for forming the groove G increases, and a tip may be generated during the etching. Therefore, according to an embodiment, the multi-layered film ML at (e.g., in or on) the middle area MA and the second organic insulating layer 211 included in the dam portions 510 and 520 are manufactured through the same or substantially the same process as each other, but the second organic insulating layer 211 included in the dam portions 510 and 520 may be formed to be thicker than the second organic insulating layer 211 included in the multi-layered film ML by using a half-tone mask. For example, the thickness of the second organic insulating layer 211 may be greater than the thickness of the second organic insulating layer 211 included in the multi-layered film ML by about 3000 Å.

Referring again to FIG. 9, a layer including an organic material from among the layers on the substrate 100 may be a path through which moisture proceeds. The first functional layer 222a and/or the second functional layer 222c include the organic material, and thus, may become the moisture permeable path described above.

However, the first functional layer 222a and/or the second functional layer 222c may be disconnected or isolated due to the groove G, and thus, the proceeding of moisture through the first functional layer 222a and/or the second functional layer 222c toward the organic light-emitting diode OLED may be prevented or substantially prevented.

Like the first functional layer 222a and/or the second functional layer 222c, the opposite electrode 223 manufactured by a thermal deposition method may be disconnected due to the groove G. The capping layer 230 including LiF and/or the like may also be disconnected by the groove G.

In another embodiment, when the capping layer 230 includes an inorganic material, for example, such as silicon nitride, silicon oxide, or silicon oxynitride, the capping layer 230 may not be disconnected by the groove G, but may be continuously formed. In another embodiment, the capping layer 230 may be omitted as needed or desired.

The thin-film encapsulation layer 300 may be on the plurality of grooves G and the dam portions 510, 520, and 530 at (e.g., in or on) the middle area MA. The thin-film encapsulation layer on the middle area MA may be a part of the thin-film encapsulation layer 300 at (e.g., in or on) the display area DA, which extends toward the middle area MA, as shown in FIG. 8.

The first inorganic encapsulation layer 310 in the thin-film encapsulation layer 300 may be continuously formed. For example, the first inorganic encapsulation layer 310 may entirely cover an inner surface of the groove G.

The organic encapsulation layer 320 may be obtained, for example, by applying a monomer on the substrate 100, and curing the monomer. As another example, the organic encapsulation layer 320 may be obtained by applying a polymer. The end portion of the organic encapsulation layer 320 facing the first area OA may be arranged to be adjacent to a side of the first dam portion 510.

When the groove G is formed from the multi-layered film ML including the first organic insulating layer 209, the metal layer 210, and the second organic insulating layer 211, cracks may occur in the tip PT of the metal layer 210, and the organic light-emitting diode OLED may be damaged.

According to an embodiment, the monomer forming the organic encapsulation layer 320 is arranged in the groove G (e.g., the first groove) between the display area and the first dam portion 510, and the monomer for forming the organic encapsulation layer 320 is arranged in the groove G (e.g., a second groove) between the first dam portion 510 and the first auxiliary dam portion 520 (e.g., the second dam portion). Thus, cracks may be prevented or substantially prevented from occurring in the grooves G adjacent to the display area, and damage to the organic light-emitting diode OLED due to the cracks may be prevented or substantially prevented.

Also, overflow of the monomer for forming the organic encapsulation layer 320 may be controlled by using the first auxiliary dam portion 520 (e.g., the second dam portion), and thus, infiltration of the monomer into the cutting line may be prevented or substantially prevented.

In order to improve white angle difference (WAD) characteristics and optical efficiency of the display apparatus, the inorganic encapsulation layer (e.g., the first inorganic encapsulation layer) may be formed by using a material having a low refractive index (e.g., a refractive index of 1.6 or less). However, when the groove G is formed by using the substrate including polymer resin, the inorganic encapsulation layer may include a material having a high refractive index (e.g., a refractive index of 1.77 or greater) in order to prevent or substantially prevent the damage to the organic light-emitting diode OLED due to moisture.

According to an embodiment, the groove G is formed by using the multi-layered film ML including the first organic insulating layer 209 and the second organic insulating layer 211 as the organic layers, and the metal layer 210 as the inorganic layer, and thus, the inorganic encapsulation layer may be formed by using a material having a low refractive index (e.g., a refractive index of 1.6 or less). Thus, the WAD characteristics and the optical efficiency may be improved. In addition, the first functional layer 222a and/or the second functional layer 222c may be disconnected (or isolated), and thus, infiltration of moisture into the organic light-emitting diode OLED through the first functional layer 222a and/or the second functional layer 222c may be prevented or substantially prevented.

The second inorganic encapsulation layer 330 may be on the organic encapsulation layer 320, and may be in direct contact with the first inorganic encapsulation layer 310 at (e.g., in or on) a part of the middle area MA. For example, the first inorganic encapsulation layer 310 and the second inorganic encapsulation layer 330 may be in direct contact with each other on the first dam portion 510 and on the first auxiliary dam portion 520 (e.g., the second dam portion). Also, the first inorganic encapsulation layer 310 and the second inorganic encapsulation layer 330 may be in direct contact with each other at (e.g., in or on) a region of the middle area MA, which is adjacent to the first area OA.

A second auxiliary dam portion 530 may be further provided at (e.g., in or on) the middle area MA, in addition to the first dam portion 510 and the first auxiliary dam portion 520 (e.g., the second dam portion). The second auxiliary dam portion 530 may have the same or substantially the same structure as that of the first auxiliary dam portion 520 (e.g., the second dam portion). The second auxiliary dam portion 520 may be closer to the first area OA than the first auxiliary dam portion 520 (e.g., the second dam portion). A groove G may also be formed between the first auxiliary dam portion 520 (e.g., the second dam portion) and the second auxiliary dam portion 530.

In an embodiment, the display apparatus 1 may include the first opening 10H corresponding to the first area OA. In another embodiment, the display apparatus 1 may not include the first opening corresponding to the first area OA, as described above with reference to FIGS. 3B to 3D.

The cross-sectional view of the display apparatus 1 shown in FIG. 9 may be understood as a structure surrounding (e.g., around a periphery of) the first area OA. For example, the grooves G in FIG. 9 may each have a loop shape surrounding (e.g., around a periphery of) the first area OA when viewed from a direction perpendicular to or substantially perpendicular to the upper surface of the substrate 100 (e.g., in a plan view) as shown in FIG. 7. Similarly, the dam portions 510, 520, and 530 may each have a loop shape surrounding (e.g., around a periphery of) the first area OA when viewed from the direction perpendicular to or substantially perpendicular to the upper surface of the substrate 100. Similarly, the elements shown in FIG. 9, for example, such as the elements (e.g., the metal layer 210) at (e.g., in or on) the middle area MA, may each have a loop shape surrounding (e.g., around a periphery of) the first area OA when viewed from the direction perpendicular to or substantially perpendicular to the upper surface of the substrate 100.

Figure 11:
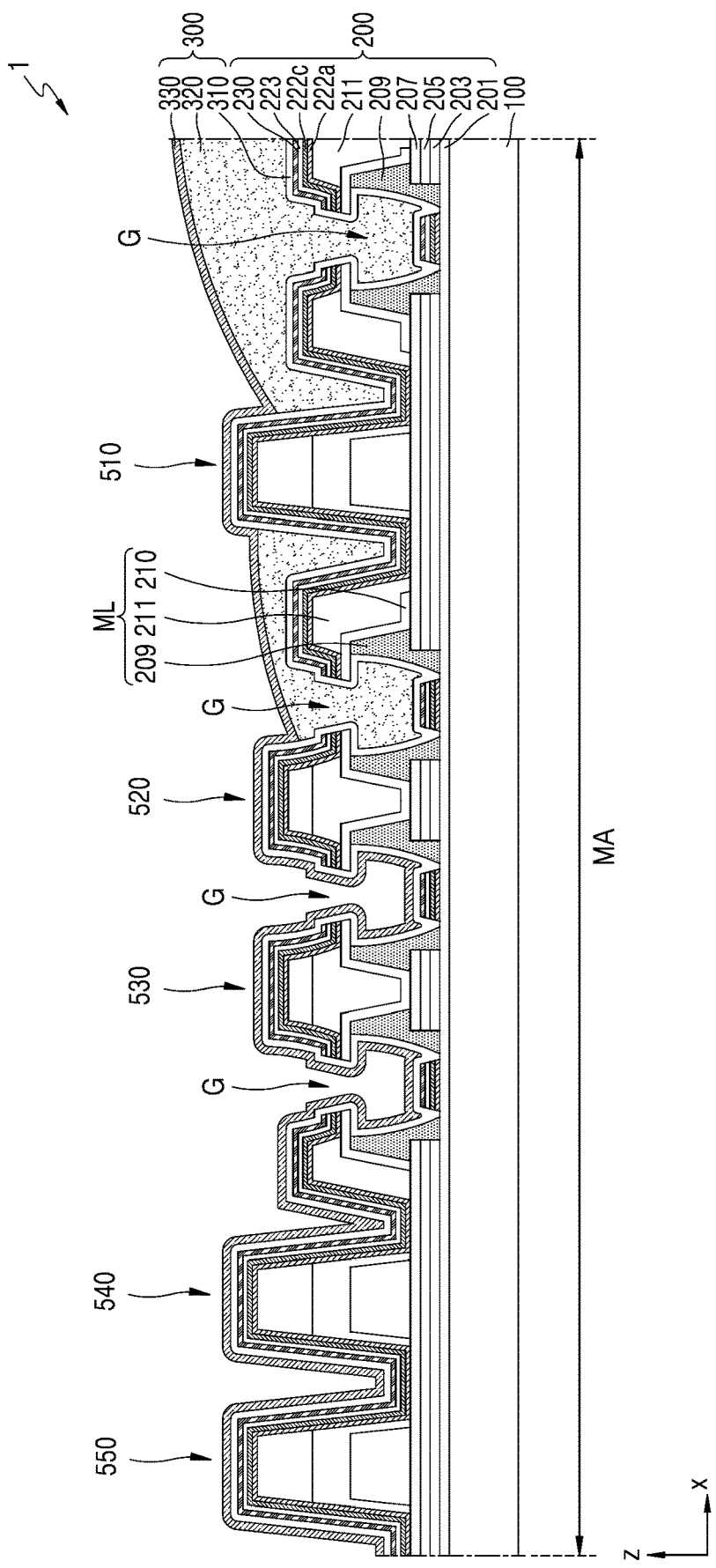
FIG. 11 is a cross-sectional view of a display apparatus according to an embodiment.

FIG. 11 is a cross-sectional view of the display apparatus 1 according to an embodiment. The embodiment of FIG. 11 may be different from the embodiment of FIG. 9, in that a second dam portion and a third dam portion are further provided at (e.g., in or on) the middle area MA in FIG. 11. Hereinafter, differences between the embodiments of FIGS. 9 and 11 will be mainly described in more detail below, and other elements in FIG. 11 may be the same or substantially the same as (or similar to) those of the embodiments described above, such that redundant description thereof may not be repeated.

Referring to FIG. 11, the display apparatus 1 according to the present embodiment may further include a second dam portion 540 and a third dam portion 550. The second dam portion 540 and the third dam portion 550 may be adjacent to (e.g., closer to) the first area OA as compared with the first dam portion 510, the first auxiliary dam portion 520, and the second auxiliary dam portion 530.

Because the display apparatus 1 further includes the second dam portion 540 and the third dam portion 550, the introduction of the monomer for forming the organic encapsulation layer 320 into the cutting line may be further prevented or substantially prevented.

In an embodiment, a groove G may be located between the second auxiliary dam portion 530 and the second dam portion 540. Also, in some embodiments, a groove G may be further provided between the second dam portion 540 and the third dam portion 550. Because the grooves G are provided between the second auxiliary dam portion 530 and the second dam portion 540, and between the second dam portion 540 and the third dam portion 550, the organic material layer in the intermediate layer 222, for example, in the first functional layer 222a and/or the second functional layer 222c, may be disconnected (or isolated) by the grooves G.

Figure 12:
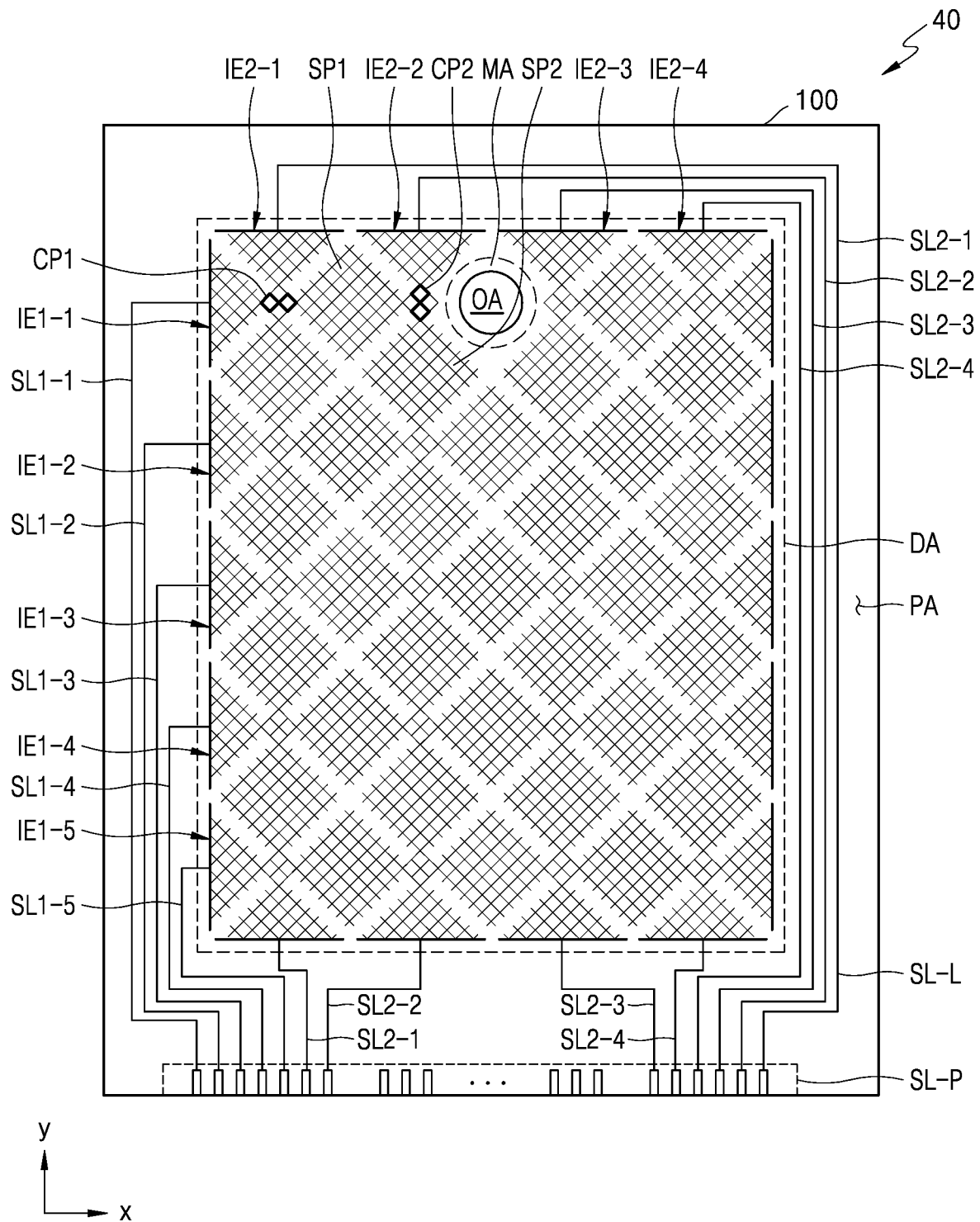
FIG. 12 is a plan view of an input sensing layer in a display apparatus according to an embodiment.

FIG. 12 is a plan view of an input sensing layer in a display apparatus according to an embodiment.

Referring to FIG. 12, the input sensing layer 40 may include first sensing electrodes IE1-1 to IE1-5, first signal lines SL1-1 to SL1-5 connected to the first sensing electrodes IE1-1 to IE1-5, second sensing electrodes IE2-1 to IE2-4, and second signal lines SL2-1 to SL2-4 connected to the second sensing electrodes IE2-1 to IE2-4.

Figure 13:
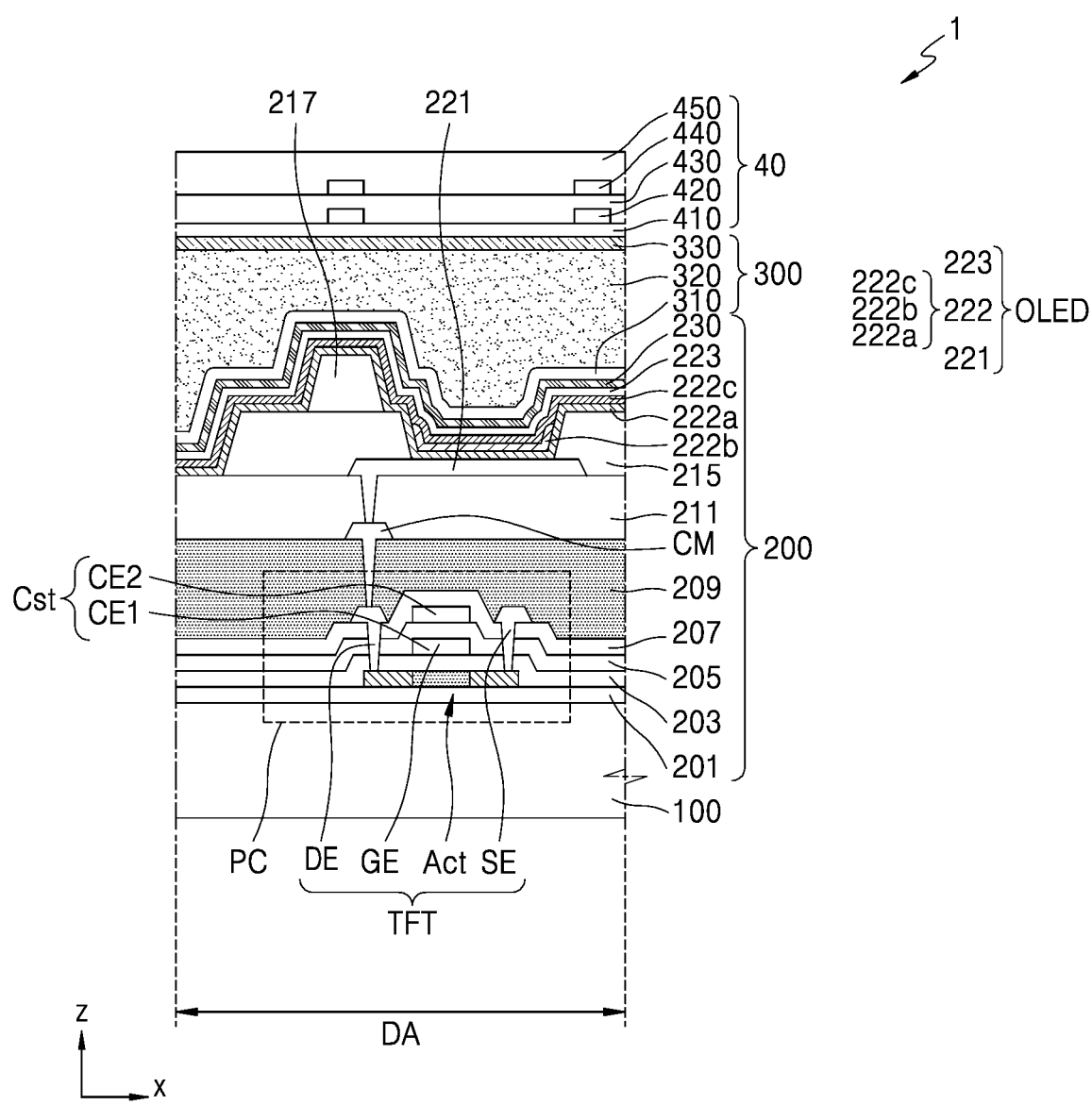
FIG. 13 is a cross-sectional view of a display apparatus according to an embodiment.

The input sensing layer 40 according to the present embodiment forms the first sensing electrodes IE1-1 to IE1-5 from a first conductive layer 420 (e.g., see FIG. 13), and forms the second sensing electrodes IE2-1 to IE2-4 from a second conductive layer 440 (e.g., see FIG. 13). FIG. 12 shows the first sensing electrodes IE1-1 to IE1-5 and the second sensing electrodes IE2-1 to IE2-4 each having a mesh shape, as an example. In an embodiment, the first sensing electrodes IE1-1 to IE1-5 and the second sensing electrodes IE2-1 to IE2-4 may have a multi-layered structure (e.g., a triple-layered structure) including Ti/Al/Ti.

Although not shown in FIG. 12, the input sensing layer 40 may further include an optical dummy electrode arranged at (e.g., in or on) a boundary region between the first sensing electrodes IE1-1 to IE1-5 and the second sensing electrodes IE2-1 to IE2-4. In this regard, the input sensing layer 40 may further include first dummy electrodes formed from the first conductive layer 420, and second dummy electrodes formed from the second conductive layer 440.

The first dummy electrodes are connected to second sensors SP2 of the second sensing electrodes IE2-1 to IE2-4 via contact holes. The second dummy electrodes are connected to first sensors SP1 of the first sensing electrodes IE1-1 to IE1-5 via contact holes. The first dummy electrodes and the second dummy electrodes may reduce resistances of the first sensing electrodes IE1-1 to IE1-5 and the second sensing electrodes IE2-1 to IE2-4.

Each of the first sensing electrodes IE1-1 to IE1-5 includes the first sensors SP1, and first connecting portions CP1. Each of the second sensing electrodes IE2-1 to IE2-4 includes the second sensors SP2, and second connecting portions CP2. From among the first sensors SP1, two first sensors at opposite ends of the first sensing electrode may have smaller sizes than those of the first sensors located at (e.g., in or on) the center, for example, such as half the size of the first sensor of the center. From among the second sensors SP2, two second sensors at opposite ends of the second sensing electrode may have smaller sizes than those of the second sensors located at (e.g., in or on) the center, for example, such as half the size of the second sensor of the center.

In FIG. 12, the first sensing electrodes IE1-1 to IE1-5 and the second sensing electrodes IE2-1 to IE2-4 are shown as having a suitable pattern (e.g., a predetermined or certain pattern), but the pattern is not limited thereto. In an embodiment, FIG. 12 shows the first sensors SP1 and the second sensors SP2 each having a trapezoidal shape, but the present disclosure is not limited thereto, and each of the first sensors SP1 and the second sensors SP2 may have another suitable polygonal shape. For example, in another embodiment, the first sensing electrodes IE1-1 to IE1-5 and the second sensing electrodes IE2-1 to IE2-4 may each have a shape in which the sensors and the connecting portions are not distinguishable from each other (e.g., a bar shape).

In one first sensing electrode, the first sensors SP1 are arranged in an x-direction. In one second sensing electrode, the second sensors SP2 are arranged in a y-direction. Each of the first connecting portions CP1 connects adjacent ones of the first sensors SP1 to each other, and each of the second connecting portions CP2 connects adjacent ones of the second sensors SP2 to each other.

The first signal lines SL1-1 to SL1-5 are respectively connected to ends of the first sensing electrodes IE1-1 to IE1-5. The second signal lines SL2-1 to SL2-4 are connected to opposite ends of the second sensing electrodes IE2-1 to IE2-4. In another embodiment, the first signal lines SL1-1 to SL1-5 may be connected to opposite ends of the first sensing electrodes IE1-1 to IE1-5. In another embodiment, the second signal lines SL2-1 to SL2-4 may be respectively connected to ends of the second sensing electrodes IE2-1 to IE2-4.

When compared with a comparative example, in which the input sensing layer 40 includes the second sensing electrodes IE2-1 to IE2-4 that are respectively connected to one ends of the second signal lines SL2-1 to SL2-4, sensitivity may be improved. The second sensing electrodes IE2-1 to IE2-4 have greater lengths as compared with the first sensing electrodes IE1-1 to IE1-5, and thus, there may be voltage drop of a detection signal (or transmission signal), such that sensitivity thereof may degrade. According to an embodiment, because the detection signal (or transmission signal) is provided via the second signal lines SL2-1 to SL2-4 connected to opposite ends of the second sensing electrodes IE2-1 to IE2-4, the voltage drop of the detection signal (or transmission signal) may be prevented or substantially prevented, and degradation in the sensitivity thereof may also be prevented or substantially prevented.

The first signal lines SL1-1 to SL1-5 and the second signal lines SL2-1 to SL2-4 may each include a line portion SL-L and a pad portion SL-P.

Referring to FIG. 12, the first sensing electrodes IE1-1 to IE1-5 and the second sensing electrodes IE2-1 to IE2-4 may each have a mesh shape. The first sensing electrodes IE1-1 to IE1-5 and the second sensing electrodes IE2-1 to IE2-4 each have the mesh shape, and thus, a parasitic capacitance with respect to the opposite electrode may be reduced.

The first sensing electrodes IE1-1 to IE1-5 and the second sensing electrodes IE2-1 to IE2-4 having the mesh shapes may include silver, aluminum, copper, chrome, nickel, titanium, and/or the like, that may be processed at a low temperature, but the present disclosure not limited thereto. Even when the input sensing layer 40 is formed through successive processes, damage to the organic light-emitting diode OLED may be prevented or substantially prevented.

FIG. 13 is a cross-sectional view of the display apparatus 1 according to an embodiment. The embodiment of FIG. 13 may be different from the embodiment of FIG. 8, in that the input sensing layer 40 is further provided on the thin-film encapsulation layer 300 in FIG. 13. Hereinafter, differences between the embodiments of FIGS. 8 and 13 will be mainly described below in more detail, and the other elements of FIG. 13 may be the same or substantially the same as (or similar to) those of the above described embodiments, such that redundant description thereof may not be repeated.

Referring to FIG. 13, the display apparatus 1 according to the present embodiment may further include the input sensing layer 40 on the thin-film encapsulation layer 300.

The input sensing layer 40 may include a first conductive layer 420 and a second conductive layer 440, each including a sensing electrode and/or a trace line. A first insulating layer 410 may be between the thin-film encapsulation layer 300 and the first conductive layer 420. In more detail, the first insulating layer 410 may be between the second inorganic encapsulation layer 330 of the thin-film encapsulation layer 300 and the first conductive layer 420. A second insulating layer 430 may be between the first conductive layer 420 and the second conductive layer 440.

The first conductive layer 420 and the second conductive layer 440 may each include a conductive material. The conductive material may include molybdenum (Mo), aluminum (Al), copper (Cu), titanium (Ti), and/or the like, and the first conductive layer 420 and the second conductive layer 440 may each have a single-layer structure or a multi-layered structure including one or more of the above described materials. In some embodiments, the first conductive layer 420 and the second conductive layer 440 may have a structure in which a titanium layer, an aluminum layer, and a titanium layer (Ti/Al/Ti) are sequentially stacked.

The first insulating layer 410 and the second insulating layer 430 may include an inorganic insulating material and/or an organic insulating material. The inorganic insulating material may include silicon oxide, silicon oxynitride, silicon nitride, and/or the like. The organic insulating material may include an acryl-based organic material or an imide-based organic material.

A third insulating layer 450 may be on the second conductive layer 440 and the second insulating layer 430. The third insulating layer 450 may be a protective layer for passivating the conductive layer of the input sensing layer 40, for example, such as the second conductive layer 440.

At least some parts of the first insulating layer 410, the second insulating layer 430, and the third insulating layer 450 included in the input sensing layer 40 of the display area DA may extend toward the middle area MA.

Figure 14:
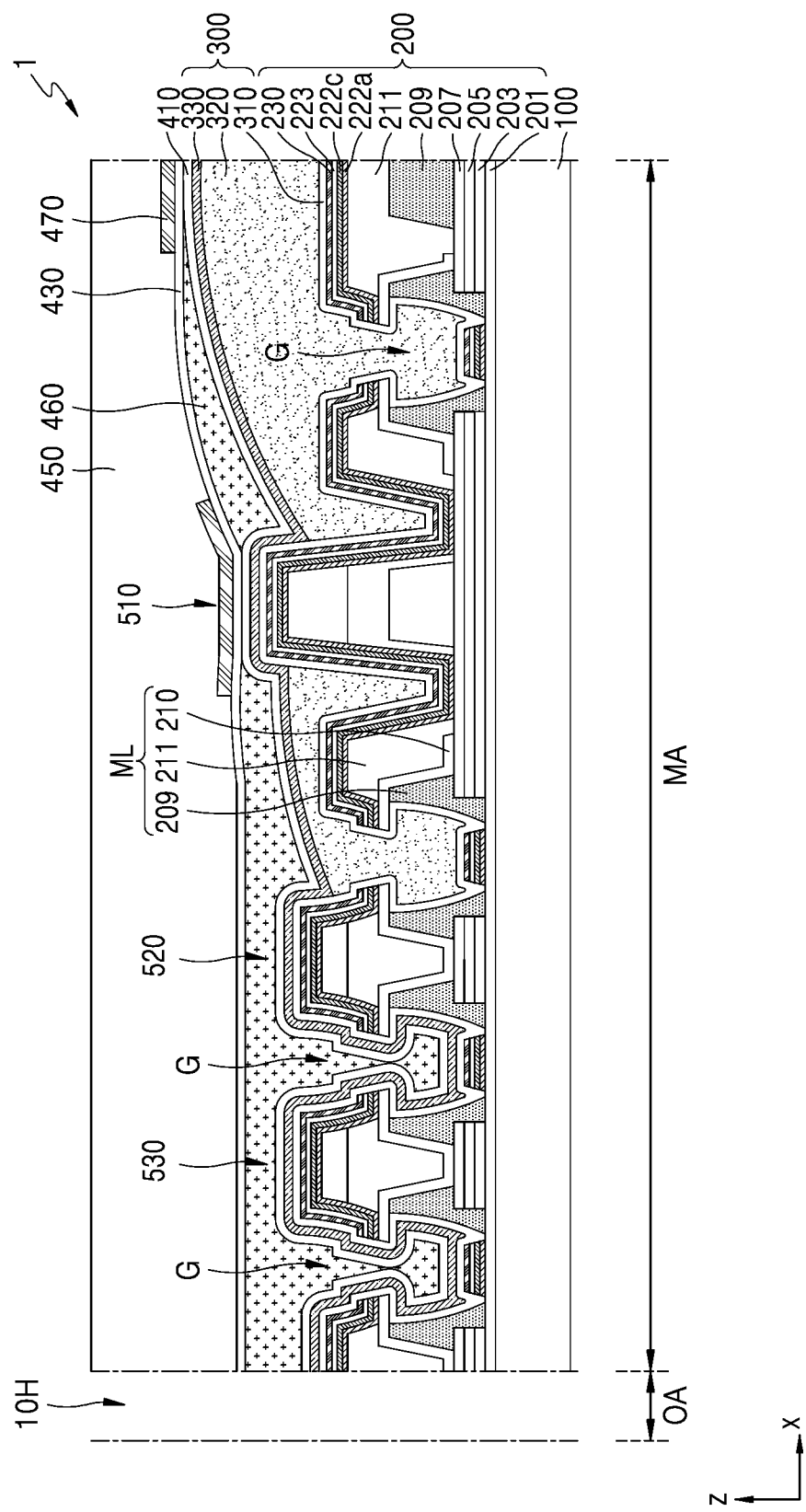
FIG. 14 is a cross-sectional view of a display apparatus according to an embodiment.

FIG. 14 is a cross-sectional view of the display apparatus 1 according to an embodiment. The embodiment of FIG. 14 may be different from the embodiment of FIG. 9, in that additional layers are further provided on the thin-film encapsulation layer 300 in FIG. 14. Hereinafter, differences between the embodiments of FIGS. 9 and 14 will be mainly described below in more detail, and the other elements of FIG. 14 may be the same or substantially the same as (or similar to) those of the above described embodiments, such that redundant description thereof may not be repeated.

Referring to FIG. 14, the display apparatus 1 according to the present embodiment may include a planarization layer 460 that is located on the thin-film encapsulation layer 300, and at (e.g., in or on) the middle area MA. In an embodiment, the planarization layer 460 may be located at (e.g., in or on) only the middle area MA.

The planarization layer 460 may include an organic insulating layer. The planarization layer 460 may include a polymer-based material. For example, the planarization layer 460 may include a silicon-based resin, an acryl-based resin, an epoxy-based resin, PI, polyethylene, and/or the like. In an embodiment, the planarization layer 460 may include the same or substantially the same material as that of the organic encapsulation layer 320. In another embodiment, the planarization layer 460 may include a different material from that of the organic encapsulation layer 320.

The planarization layer 460 may cover at least one groove G at (e.g., in or on) the middle area MA. The planarization layer 460 covers a region at (e.g., in or on) the middle area MA, which is not covered by the organic encapsulation layer 320, and may increase a flatness of the display apparatus 1 around the first area OA. Therefore, isolation or elimination of the input sensing layer 40 (e.g., see FIG. 12) of the display apparatus 1 may be prevented or substantially prevented.

In FIG. 13, the first insulating layer 410, the second insulating layer 430, and the third insulating layer 450 of the input sensing layer 40 may be also be located at (e.g., in or on) the middle area MA. The planarization layer 460 may be formed on the middle area MA through exposure and development processes and/or the like, and during some processes (e.g., a cleaning process) from among the processes of forming the planarization layer 460, the organic light-emitting diode OLED of the display apparatus 1 may be damaged when external impurities, for example, such as moisture, proceeds along a lateral direction of the display apparatus 1. However, according to one or more embodiments, the insulating layers, for example, the first insulating layer 410 and the second insulating layer 430, are on and under the planarization layer 460, and thus, the above-described issues caused by the moisture infiltration during and after the process of forming the planarization layer 460 and/or lifting of peripheral layers may be prevented or substantially prevented.

The first insulating layer 410 and the second insulating layer 430 may be in direct contact with a bottom surface and an upper surface of the planarization layer 460, respectively.

A cover layer 470 may be on the second insulating layer 430 at (e.g., in or on) the middle area MA, in order to prevent or substantially prevent the planarization layer 460 from isolating or lifting from the layer thereunder. The cover layer 470 may be on a portion where there is a step between the first insulating layer 410 and the planarization layer 460, and/or a step between the second insulating layer 430 and the planarization layer 460.

The cover layer 470 may include the same or substantially the same material and through the same or substantially the same process as those of the first conductive layer 420 or the second conductive layer 440 of the input sensing layer 40 described above with reference to FIG. 13.

Figure 15:
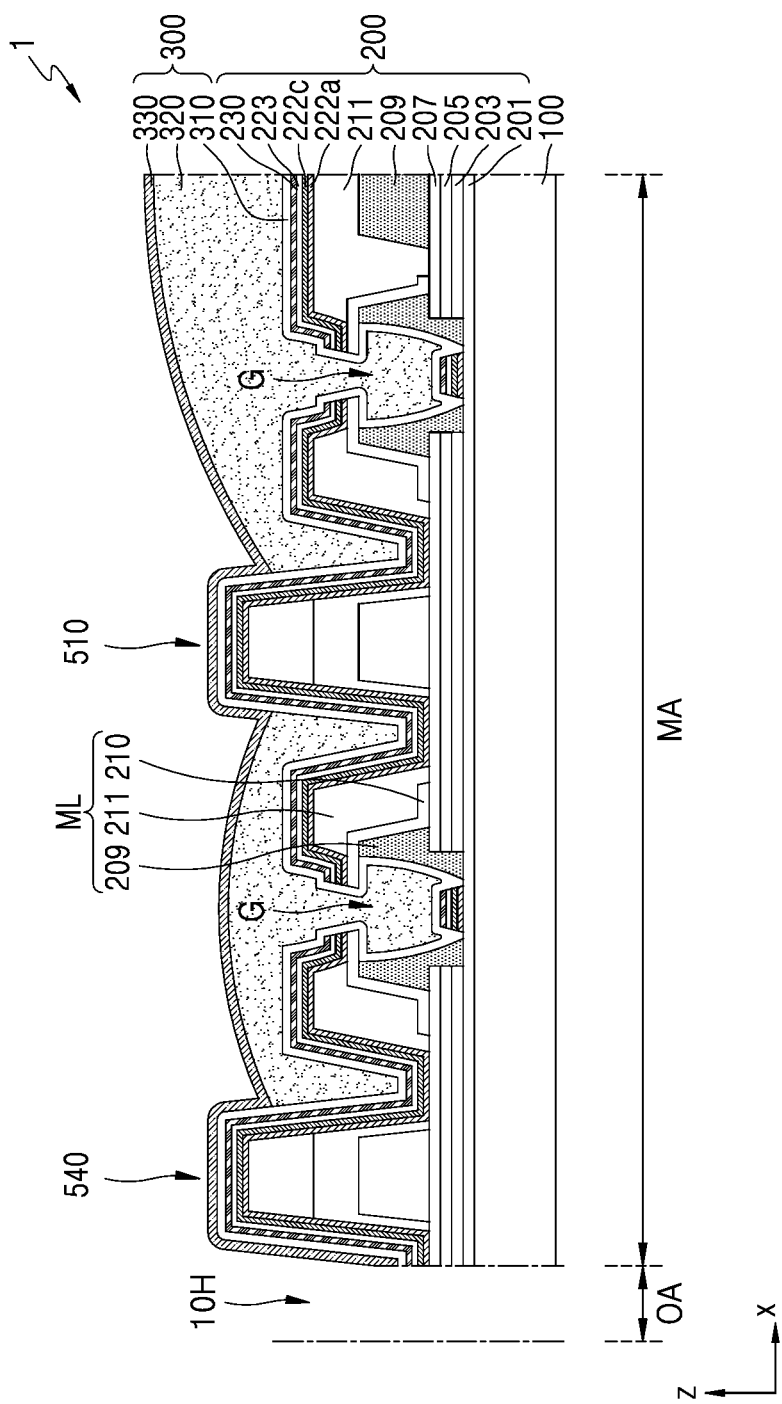
FIG. 15 is a cross-sectional view of a display apparatus according to an embodiment.

FIG. 15 is a cross-sectional view of the display apparatus 1 according to an embodiment. The embodiment of FIG. 15 may be different from the embodiment of FIG. 9, in that the monomer is controlled by means of the first dam portion and the second dam portion in FIG. 15. Hereinafter, differences between the embodiments of FIGS. 9 and 15 will be mainly described in more detail below, and the other elements in FIG. 15 may be the same or substantially the same as (or similar to) those of the above described embodiments, such that redundant description thereof may not be repeated.

Referring to FIG. 15, the grooves G and the dam portions 510 and 540 may be at (e.g., in or on) the middle area MA. The display apparatus 1 according to the present embodiment may include the first dam portion 510 that is adjacent to the display area DA, and a second dam portion 540 that is spaced apart from the first dam portion 510. The groove G (e.g., a first groove) is between the display area DA and the first dam portion 510, and the groove G (e.g., a second groove) may be between the first dam portion 510 and the second dam portion 540.

A monomer for forming the organic encapsulation layer 320 may be in the groove G (e.g., the first groove) between the display area DA and the first dam portion 510, and in the groove G (e.g., the second groove) between the first dam portion 510 and the second dam portion 540.

According to an embodiment, the monomer forming the organic encapsulation layer 320 is arranged in the groove G (e.g., the first groove) between the display area and the first dam portion 510, and the monomer for forming the organic encapsulation layer 320 is arranged in the groove G (e.g., the second groove) between the first dam portion 510 and the second dam portion 540. Thus, cracks may be prevented or substantially prevented from occurring in the grooves G adjacent to the display area, and damage to the organic light-emitting diode OLED due to the cracks may be prevented or substantially prevented.

Also, overflow of the monomer for forming the organic encapsulation layer 320 may be controlled by using the second dam portion 540, and thus, infiltration of the monomer into the cutting line may be prevented or substantially prevented.

The second inorganic encapsulation layer 330 may be on the organic encapsulation layer 320, and may be in direct contact with the first inorganic encapsulation layer 310 at (e.g., in or on) a part of the middle area MA. The first inorganic encapsulation layer 310 and the second inorganic encapsulation layer 330 may be in direct contact with each other on the first dam portion 510 and the second dam portion 540. Also, the first inorganic encapsulation layer 310 and the second inorganic encapsulation layer 330 may be in direct contact with each other at (e.g., in or on) a region of the middle area MA, which is adjacent to the first area OA.

Figure 16:
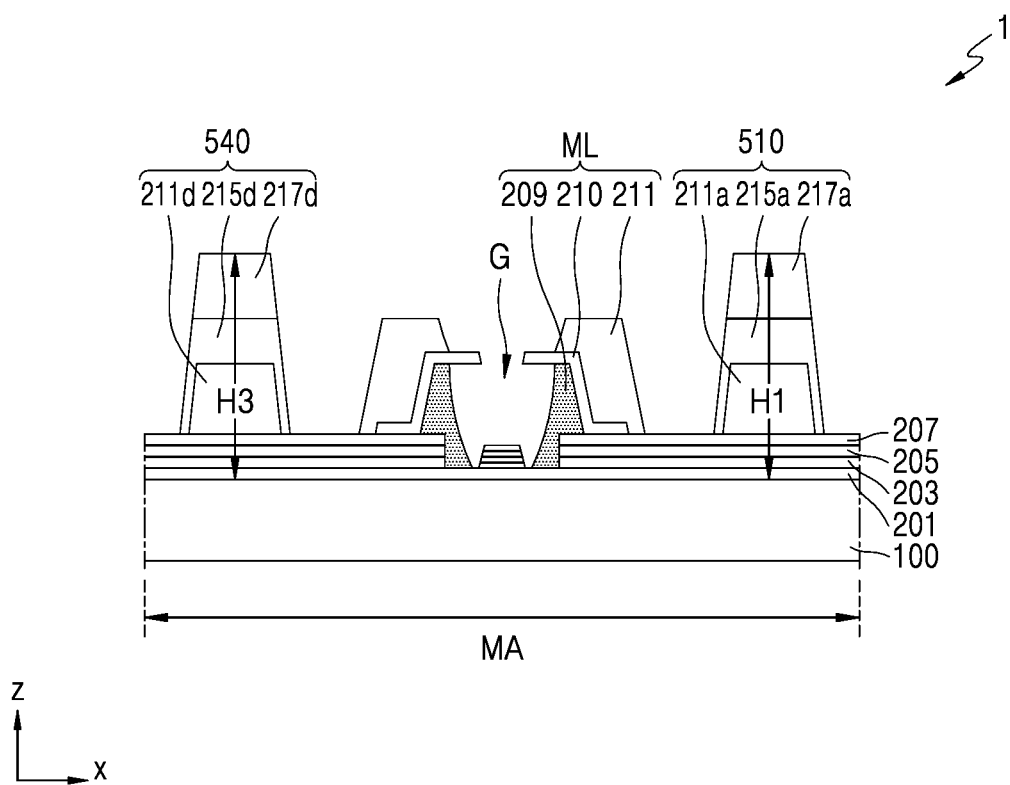
FIG. 16 is a cross-sectional view of a display apparatus according to an embodiment.

FIG. 16 is a cross-sectional view of the display apparatus 1 according to an embodiment. In more detail, FIG. 16 is a diagram illustrating the first dam portion 510 and the second dam portion 540 of FIG. 15 in more detail, and shows a structure before the intermediate layer of the organic light-emitting diode OLED is formed. Referring to FIG. 15 and FIG. 16, the display apparatus 1 according to the present embodiment may include the first dam portion 510 and the second dam portion 540 at (e.g., in or on) the middle area MA, and the groove G (e.g., the second groove) between the first dam portion 510 and the second dam portion 540. The structures of the first dam portion 510 and the groove G (e.g., the second groove) between the first dam portion 510 and the second dam portion 540 may be the same or substantially the same as (or similar to) those described above with reference to FIG. 10.

The second dam portion 540 may have a structure in which a portion 211d of the second organic insulating layer 211, a portion 215d of the third organic insulating layer 215, and a portion 217d of the fourth organic insulating layer 217 are stacked.

In an embodiment, an upper surface of the first dam portion 510 has a first height H1 from the upper surface of the substrate 100, and an upper surface of the second dam portion 540 may have a third height H3 from the upper surface of the substrate 100. Here, the first height H1 of the first dam portion 510 may be greater than or equal to the third height H3 of the second dam portion 540. When the first dam portion 510 is equal to or larger than the second dam portion 540, loss of the monomer for forming the organic encapsulation layer into a cutting line may be prevented or reduced.

Figure 17:
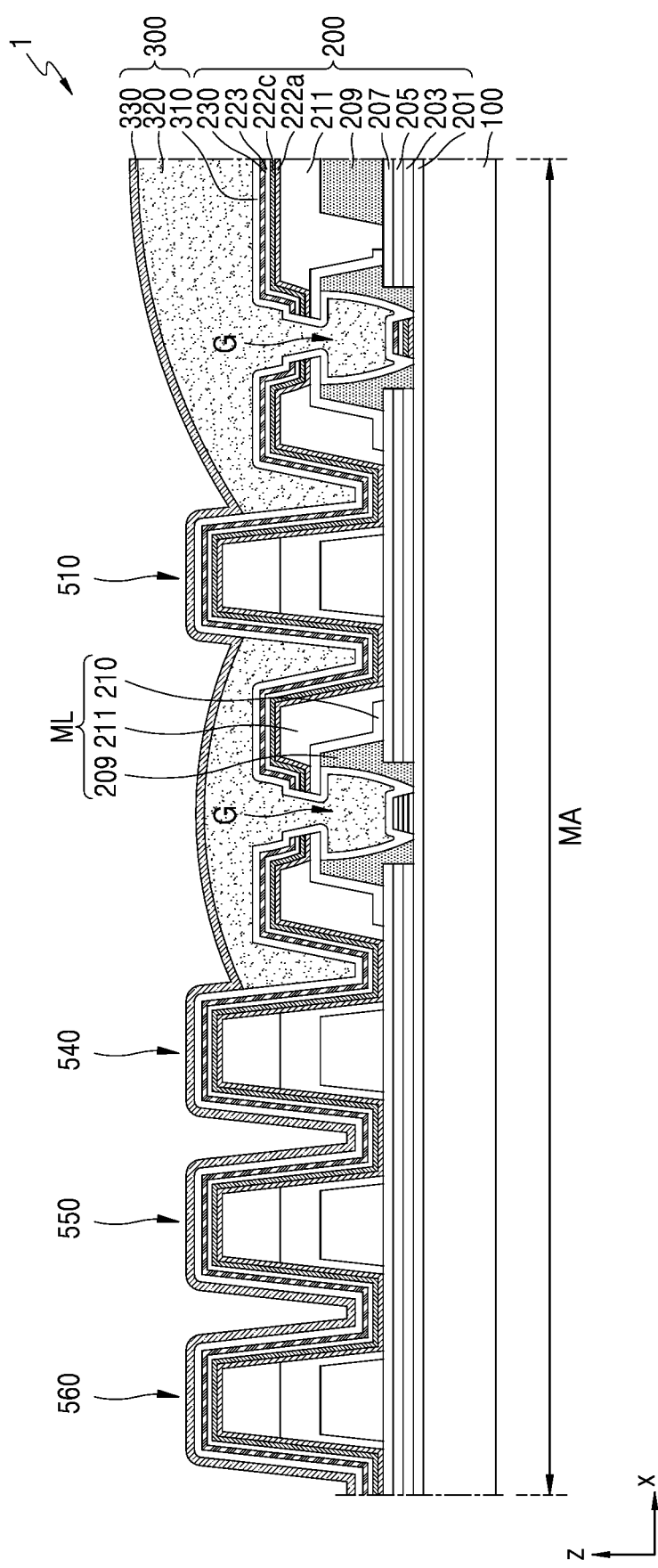
FIG. 17 is a cross-sectional view of a display apparatus according to an embodiment.

FIG. 17 is a cross-sectional view of the display apparatus 1 according to an embodiment. The embodiment of FIG. 17 may be different from the embodiment of FIG. 15, in that a third dam portion and a fourth dam portion are further provided at (e.g., in or on) the middle area MA in FIG. 17. Hereinafter, differences between the embodiments of FIGS.

15 and 17 may be mainly described in more detail below, and the other elements of FIG. 17 may be the same or substantially the same as (or similar to) those of the above described embodiments, such that redundant description thereof may not be repeated.

Referring to FIG. 17, the display apparatus 1 according to the present embodiment may further include the third dam portion 550 and the fourth dam portion 560 at (e.g., in or on) the middle area MA. The third dam portion 550 and the fourth dam portion 560 may be adjacent to (e.g., closer to) the first area OA as compared with the first dam portion 510 and the second dam portion 540.

Because the display apparatus 1 further includes the third dam portion 550 and the fourth dam portion 560, the introduction of the monomer for forming the organic encapsulation layer 320 into the cutting line may be prevented or substantially prevented.

Although not shown in FIG. 17, a groove G may further be provided between the second dam portion 540 and the third dam portion 550. Also, a groove G may also be provided between the third dam portion 550 and the fourth dam portion 560. Because the grooves G are between the second dam portion 540 and the third dam portion 550, and between the third dam portion 550 and the fourth dam portion 560, the organic material layer, for example, the first functional layer 222a and/or the second functional layer 222c, in the intermediate layer 222 may be disconnected (or isolated) by the grooves G.

Figure 18:
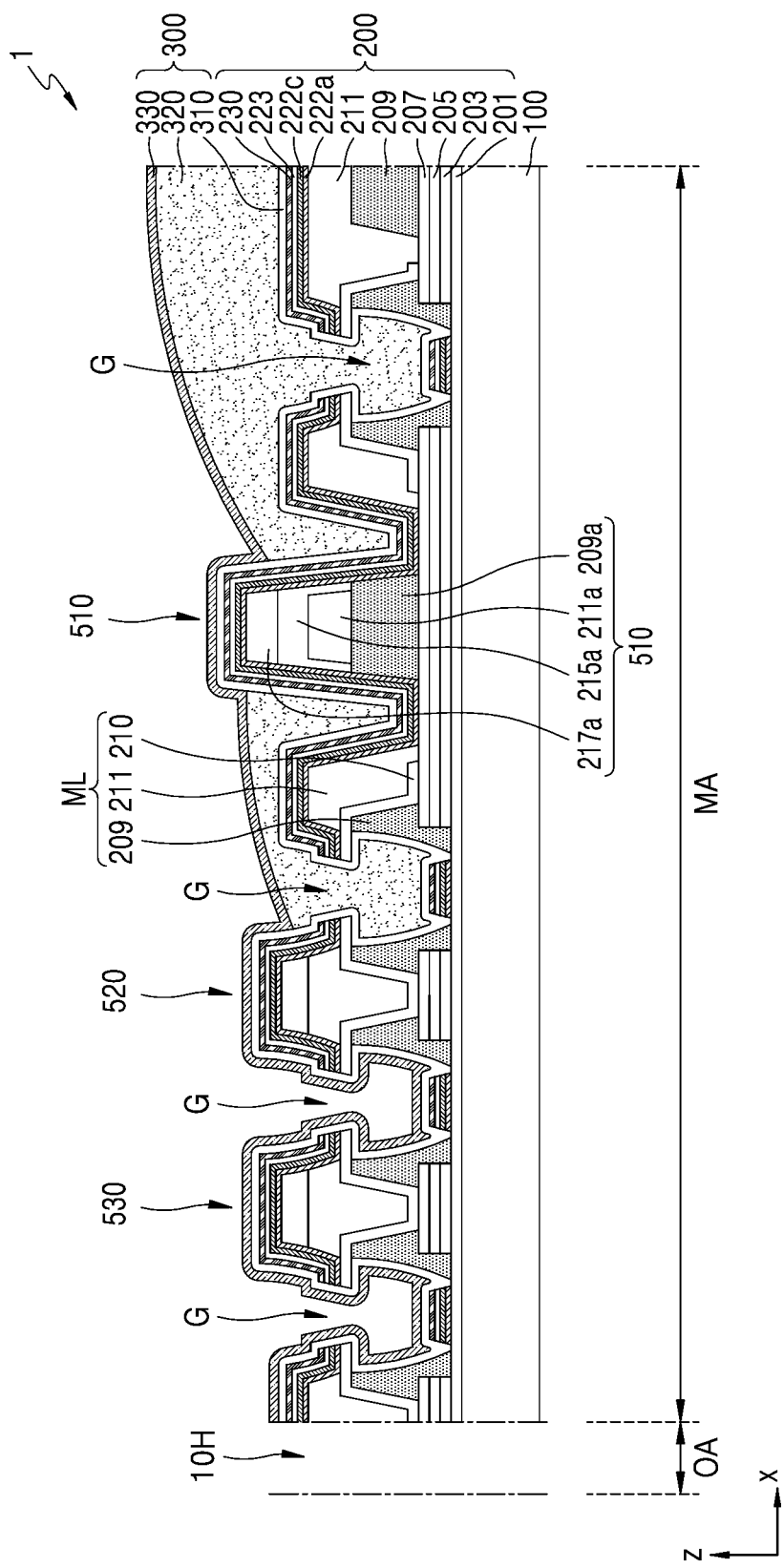
FIG. 18 is a cross-sectional view of a display apparatus according to an embodiment.

FIG. 18 is a cross-sectional view of the display apparatus 1 according to an embodiment. The embodiment of FIG. 18 may be different from the embodiment of FIG. 9, in that the first dam portion 510 further includes a portion 209a of the first organic insulating layer 209 in FIG. 18. Hereinafter, differences between the embodiments of FIGS. 9 and 18 may be mainly described in more detail below, and the other elements in FIG. 18 may be the same or substantially the same as (or similar to) those of the above described embodiments, such that redundant description thereof may not be repeated.

Referring to FIG. 18, the display apparatus 1 according to the present embodiment may include the dam portions 510, 520, 530, and 540. In more detail, the display apparatus 1 may include the first dam portion 510, the first auxiliary dam portion 520, the second auxiliary dam portion 530, and the second dam portion 540.

The grooves G may be provided between the display area DA and the first dam portion 510, between the first dam portion 510 and the first auxiliary dam portion 520, between the first auxiliary dam portion 520 and the second auxiliary dam portion 530, and between the second auxiliary dam portion 530 and the second dam portion 540, respectively.

The first dam portion 510 may include a plurality of sub-organic insulating layers that are sequentially stacked. In an embodiment, the first dam portion 510 may have a structure in which a portion 209a of the first organic insulating layer 209, a portion 211a of the second organic insulating layer 211, a portion 215a of the third organic insulating layer 215, and a portion 217a of the fourth organic insulating layer 217 are stacked. In another embodiment, one or more from among the portion 209a of the first organic insulating layer 209, the portion 211a of the second organic insulating layer 211, the portion 215a of the third organic insulating layer 215, and the portion 217a of the fourth organic insulating layer 217 may be omitted, and in this case, a height from the substrate 100 to the upper surface of the first dam portion 510 may be less than a height from the substrate 100 to the upper surface of the fourth organic insulating layer 217.

Figure 19:
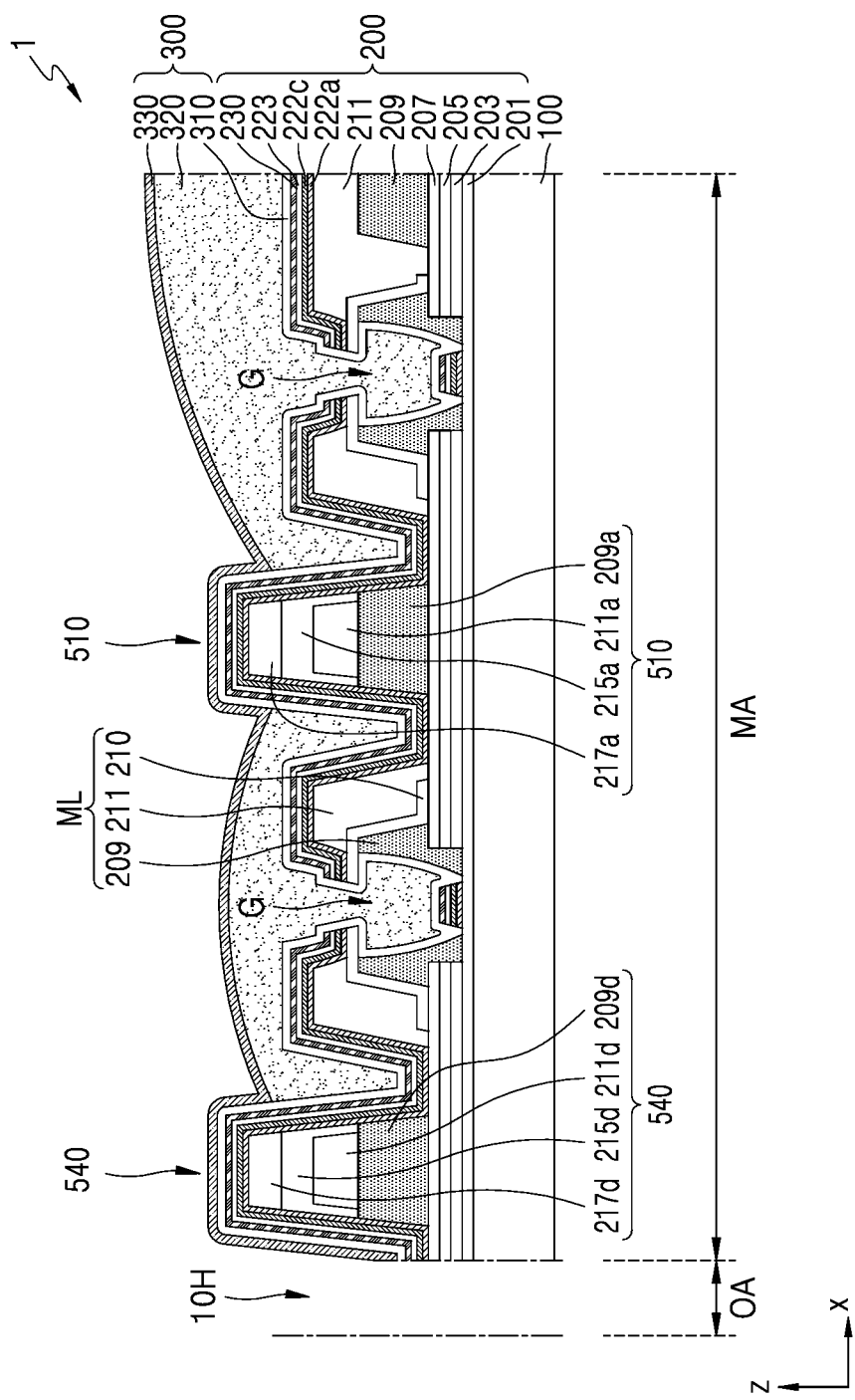
FIG. 19 is a cross-sectional view of a display apparatus according to an embodiment.

FIG. 19 is a cross-sectional view of the display apparatus 1 according to an embodiment. The embodiment of FIG. 19 may be different from the embodiment of FIG. 15, in that the first dam portion 510 and the second dam portion 540 further include the portion 209a of the first organic insulating layer 209 in FIG. 19. Hereinafter, differences between the embodiments of FIGS. 15 and 19 may be mainly described in more detail below, and the other elements in FIG. 19 may be the same or substantially the same as (or similar to) those of the above described embodiments, such that redundant description thereof may not be repeated.

Referring to FIG. 19, the display apparatus 1 according to the present embodiment may include the dam portions 510 and 540. In more detail, the display apparatus 1 may include the first dam portion 510 and the second dam portion 540.

The grooves G may be provided between the display area DA and the first dam portion 510, and between the first dam portion 510 and the second dam portion 540, respectively.

The first dam portion 510 may include a plurality of sub-organic insulating layers that are sequentially stacked. In an embodiment, the first dam portion 510 may have a structure in which a portion 209a of the first organic insulating layer 209, a portion 211a of the second organic insulating layer 211, a portion 215a of the third organic insulating layer 215, and a portion 217a of the fourth organic insulating layer 217 are stacked. In another embodiment, one or more from among the portion 209a of the first organic insulating layer 209, the portion 211a of the second organic insulating layer 211, the portion 215a of the third organic insulating layer 215, and the portion 217a of the fourth organic insulating layer 217 may be omitted.

The second dam portion 540 may include a plurality of sub-organic insulating layers that are sequentially stacked. In an embodiment, the second dam portion 540 may have a structure in which a portion 209d of the first organic insulating layer 209, a portion 211d of the second organic insulating layer 211, a portion 215d of the third organic insulating layer 215, and a portion 217d of the fourth organic insulating layer 217 are stacked. In another embodiment, one or more from among the portion 209d of the first organic insulating layer 209, the portion 211d of the second organic insulating layer 211, the portion 215d of the third organic insulating layer 215, and the portion 217d of the fourth organic insulating layer 217 may be omitted.

In the display apparatus according to one or more embodiments of the present disclosure, damage to the display elements due to external impurities, for example, such as moisture, in the first area may be prevented or substantially prevented.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:

1. A display apparatus comprising:
a substrate comprising a first area, a second area, and a third area between the first area and the second area, the first area having a through hole;
a display element at the second area, the display element comprising a pixel electrode, an opposite electrode, and an intermediate layer between the pixel electrode and the opposite electrode, and the intermediate layer comprising at least one organic material layer;
a thin-film encapsulation layer covering the display element, and comprising a first inorganic encapsulation layer, a second inorganic encapsulation layer, and an organic encapsulation layer between the first inorganic encapsulation layer and the second inorganic encapsulation layer;
a first dam portion at the third area, the first dam portion being adjacent to the second area;
a second dam portion at the third area, and spaced from the first dam portion; and
at least one groove at the third area,
wherein the at least one organic material layer of the intermediate layer is disconnected by the at least one groove,
wherein a groove from among the at least one groove is between the first dam portion and the second dam portion, and at least a part of the organic encapsulation layer is at the at least one groove, and
wherein the display apparatus further comprises a metal layer between the substrate and the opposite electrode, the metal layer defining a portion of the at least one groove.

2. The display apparatus of claim 1, wherein the at least one organic material layer comprises one or more selected from among a hole transport layer, a hole injection layer, an electron injection layer, and an electron transport layer.

3. The display apparatus of claim 1, wherein the first inorganic encapsulation layer and the second inorganic encapsulation layer are in contact with each other on an upper surface of the first dam portion.

4. The display apparatus of claim 1, further comprising an input sensing layer on the thin-film encapsulation layer, the input sensing layer comprising an insulating layer and at least one conductive layer that comprises a sensing electrode or a trace line.

5. The display apparatus of claim 4, wherein the input sensing layer comprises:
a first insulating layer on the thin-film encapsulation layer;
a first conductive layer on the first insulating layer at the second area;
a second insulating layer covering the first conductive layer;
a second conductive layer on the second insulating layer at the second area; and
a third insulating layer covering the second conductive layer.

6. The display apparatus of claim 5, wherein at least a portion of the first insulating layer, at least a portion of the second insulating layer, and at least a portion of the third insulating layer are at the third area.

7. The display apparatus of claim 6, further comprising:
a planarization layer at the third area, the planarization layer being between the first insulating layer and the second insulating layer; and
a cover layer on the second insulating layer.

8. The display apparatus of claim 1, wherein the at least one groove has an undercut structure.

9. A display apparatus comprising:
a substrate comprising a first area, a second area, and a third area between the first area and the second area, the first area having a through hole;
a display element at the second area, the display element comprising a pixel electrode, an opposite electrode, and an intermediate layer between the pixel electrode and the opposite electrode, and the intermediate layer comprising at least one organic material layer;
a thin-film encapsulation layer covering the display element, and comprising a first inorganic encapsulation layer, a second inorganic encapsulation layer, and an organic encapsulation layer between the first inorganic encapsulation layer and the second inorganic encapsulation layer;
a first dam portion at the third area, the first dam portion being adjacent to the second area;
a second dam portion at the third area, and spaced from the first dam portion;
at least one groove at the third area; and
a multi-layered film between the substrate and the opposite electrode, the multi-layered film comprising a first organic insulating layer, a second organic insulating layer, and a metal layer between the first organic insulating layer and the second organic insulating layer,
wherein the at least one organic material layer of the intermediate layer is disconnected by the at least one groove, and
wherein a groove from among the at least one groove is between the first dam portion and the second dam portion, and at least a part of the organic encapsulation layer is at the at least one groove.

10. The display apparatus of claim 9, wherein the at least one groove is in the multi-layered film.

11. The display apparatus of claim 9, further comprising a pixel circuit comprising a thin-film transistor and a storage capacitor, the thin-film transistor being electrically connected to the display element,
wherein a contact metal layer connects the display element and the thin-film transistor to each other, and
wherein the metal layer and the contact metal layer include the same material as each other.

12. The display apparatus of claim 9, wherein the at least one groove comprises:
a first hole penetrating through the metal layer;
a second hole penetrating through the first organic insulating layer; and
a third hole penetrating through the second organic insulating layer.

13. The display apparatus of claim 9, further comprising:
a third organic insulating layer at least partially exposing the pixel electrode; and
a fourth organic insulating layer on the third organic insulating layer,
wherein the first dam portion comprises at least one selected from among the first organic insulating layer, the second organic insulating layer, the third organic insulating layer, and the fourth organic insulating layer.

14. The display apparatus of claim 13, wherein the second dam portion comprises at least one selected from among the first organic insulating layer, the second organic insulating layer, and the third organic insulating layer.

15. The display apparatus of claim 14, wherein an upper surface of the first dam portion has a first height from an upper surface of the substrate, an upper surface of the second dam portion has a second height from the upper surface of the substrate, and the second height is less than or equal to the first height.

16. The display apparatus of claim 13, wherein the second dam portion comprises at least one selected from among the first organic insulating layer, the second organic insulating layer, the third organic insulating layer, and the fourth organic insulating layer.

17. The display apparatus of claim 16, wherein an upper surface of the first dam portion has a first height from an upper surface of the substrate, an upper surface of the second dam portion has a third height from the upper surface of the substrate, and the third height is less than or equal to the first height.

18. The display apparatus of claim 9, wherein the multi-layered film comprises at least one lower insulating layer under the first organic insulating layer, and the at least one lower insulating layer comprises an inorganic insulating layer.

19. The display apparatus of claim 18, wherein a bottom surface of the at least one groove is at a virtual surface that is between an upper surface of the substrate and an upper surface of the at least one lower insulating layer.

20. The display apparatus of claim 18, wherein the at least one lower insulating layer has an opening overlapping with the at least one groove.

21. A display apparatus comprising:
a substrate comprising a first area, a second area, and a third area between the first area and the second area, the first area having a through hole;
a display element at the second area, the display element comprising a pixel electrode, an opposite electrode, and an intermediate layer between the pixel electrode and the opposite electrode, and the intermediate layer comprising at least one organic material layer;
a thin-film encapsulation layer covering the display element, and comprising a first inorganic encapsulation layer, a second inorganic encapsulation layer, and an organic encapsulation layer between the first inorganic encapsulation layer and the second inorganic encapsulation layer;
a first dam portion at the third area, the first dam portion being adjacent to the second area;
a second dam portion at the third area, and spaced from the first dam portion; and
at least one groove between the first dam portion and the second dam portion, wherein the at least one organic material layer of the intermediate layer is disconnected by the at least one groove,
at least a portion of the organic encapsulation layer is in the at least one groove that is between the first dam portion and the second dam portion, and adjacent to the first dam portion, and
wherein the display apparatus further comprises a metal layer between the substrate and the opposite electrode, the metal layer defining a portion of the at least one groove.

22. The display apparatus of claim 21, further comprising a multi-layered film between the substrate and the opposite electrode, the multi-layered film comprising a first organic insulating layer, a second organic insulating layer, and the metal layer between the first organic insulating layer and the second organic insulating layer,
wherein the at least one groove is in the multi-layered film.

23. The display apparatus of claim 22, further comprising:
a third organic insulating layer at least partially exposing the pixel electrode; and
a fourth organic insulating layer on the third organic insulating layer,
wherein the first dam portion comprises at least one selected from among the first organic insulating layer, the second organic insulating layer, the third organic insulating layer, and the fourth organic insulating layer.

24. The display apparatus of claim 23, further comprising a first auxiliary dam portion between the first dam portion and the second dam portion,
wherein the first auxiliary dam portion comprises the second organic insulating layer and the third organic insulating layer.

25. The display apparatus of claim 24, wherein an upper surface of the first dam portion has a first height from an upper surface of the substrate, an upper surface of the first auxiliary dam portion has a second height from the upper surface of the substrate, and the second height is less than or equal to the first height.

26. The display apparatus of claim 23, wherein an upper surface of the first dam portion has a first height from an upper surface of the substrate, an upper surface of the second dam portion has a third height from the upper surface of the substrate, and the third height is less than or equal to the first height.

27. The display apparatus of claim 21, further comprising an input sensing layer on the thin-film encapsulation layer, the input sensing layer comprising an insulating layer and at least one conductive layer that comprises a sensing electrode or a trace line.

28. The display apparatus of claim 27, wherein the input sensing layer comprises:
a first insulating layer on the thin-film encapsulation layer;
a first conductive layer on the first insulating layer at the second area;
a second insulating layer covering the first conductive layer;
a second conductive layer on the second insulating layer at the second area; and
a third insulating layer covering the second conductive layer.

29. The display apparatus of claim 28, wherein at least a portion of the first insulating layer, at least a portion of the second insulating layer, and at least a portion of the third insulating layer are at the third area.

30. The display apparatus of claim 29, further comprising:
a planarization layer at the third area, the planarization layer being between the first insulating layer and the second insulating layer; and
a cover layer on the second insulating layer.

* * * * *